(12) United States Patent
Uchigaito et al.

(10) Patent No.: US 9,268,486 B2
(45) Date of Patent: *Feb. 23, 2016

(54) INFORMATION PROCESSOR

(71) Applicant: HITACHI, LTD., Tokyo (JP)

(72) Inventors: Hiroshi Uchigaito, Kodaira (JP); Kenzo Kurotsuchi, Kodaira (JP); Seiji Miura, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/799,795

(22) Filed: Jul. 15, 2015

(65) Prior Publication Data

US 2015/0317086 A1  Nov. 5, 2015

Related U.S. Application Data

(63) Continuation of application No. 13/875,448, filed on May 2, 2013, now Pat. No. 9,099,171.

(30) Foreign Application Priority Data

Jun. 8, 2012 (JP) ................................. 2012-130641

(51) Int. Cl.
 *G06F 9/26* (2006.01)
 *G06F 3/06* (2006.01)
 *G06F 17/30* (2006.01)
(52) U.S. Cl.
 CPC ............ *G06F 3/0611* (2013.01); *G06F 3/0647* (2013.01); *G06F 3/0683* (2013.01); *G06F 17/30318* (2013.01); *G06F 17/30958* (2013.01)
(58) Field of Classification Search
 None
 See application file for complete search history.

(56) References Cited

U.S. PATENT DOCUMENTS

| | | | |
|---|---|---|---|
| 2005/0253858 A1* | 11/2005 | Ohkami et al. | 345/531 |
| 2007/0276989 A1 | 11/2007 | Mosek et al. | |
| 2008/0243831 A1* | 10/2008 | Kunitake | 707/5 |
| 2013/0317747 A1* | 11/2013 | Chidlovskii et al. | 701/540 |

FOREIGN PATENT DOCUMENTS

JP   2009-539168   11/2009

OTHER PUBLICATIONS

Jatin Chhugani et al, "Fast and Efficient Graph Traversal Algorithm for CPUs: Maximizing Single-Node Efficiency;" 2012 IEEE 26th International; pp. 378-389; May 2012.*
Jatin Chhugani et al, "Fast and Efficient Graph Traversal Algorithm for CPUs: Maximizing Single-Node Efficiency;" 2012 IEEE, 26th International; pp. 378-389; May 2012.

* cited by examiner

*Primary Examiner* — Aimee Li
*Assistant Examiner* — Dustin Bone
(74) *Attorney, Agent, or Firm* — Mattingly & Malur, PC

(57) ABSTRACT

An information processor includes an information processing sub-system having information processing circuits and a memory sub-system performing data communication with the information processing sub-systems, wherein the memory sub-system has a first memory, a second memory, a third memory having reading and writing latencies longer than those of the first memory and the second memory, and a memory controller for controlling data transfer among the first memory, the second memory and the third memory; graph data is stored in the third memory; the memory controller analyzes data blocks serving as part of the graph data, and performs preloading operation repeatedly to transfer the data blocks to be required next for the execution of the processing from the third memory to the first memory or the second memory on the basis of the result of the analysis.

5 Claims, 24 Drawing Sheets

FIG. 17
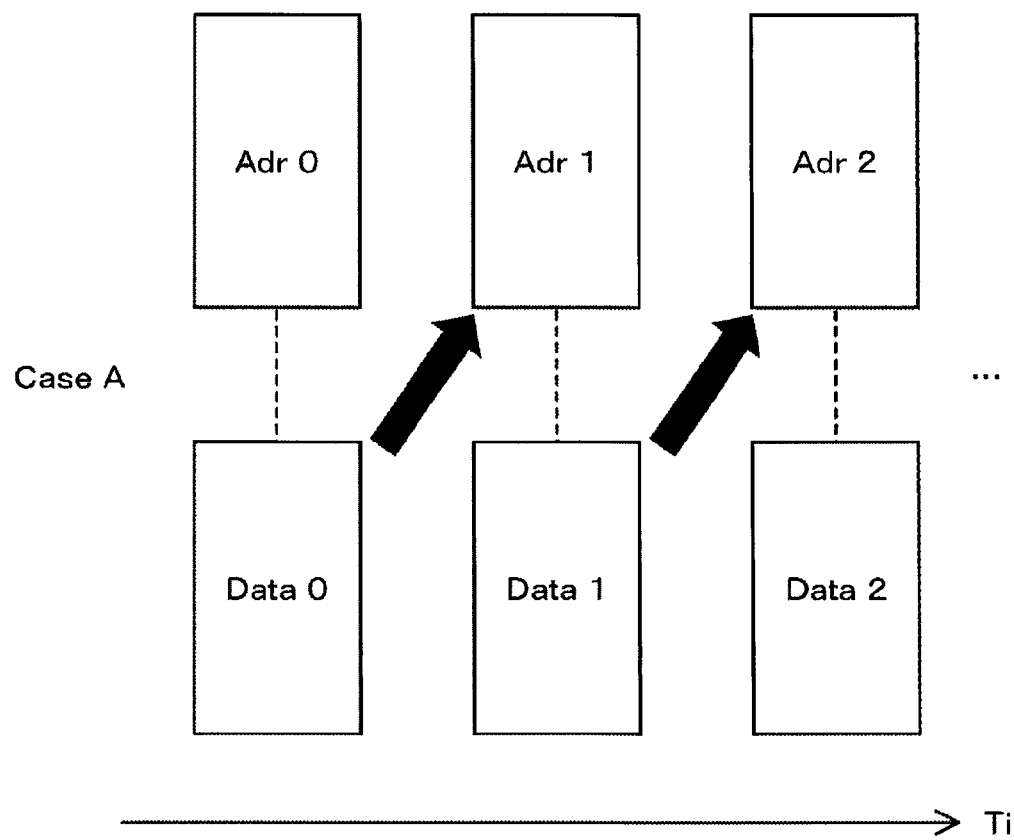
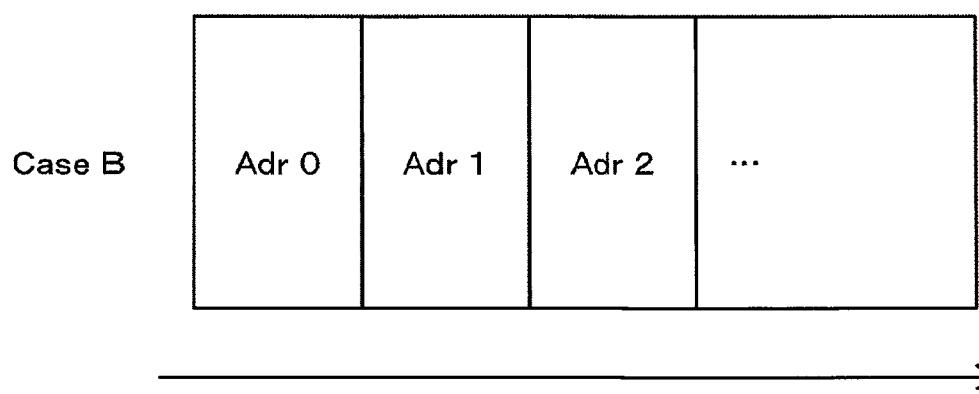

"0": not preloaded
"1": preloaded

Data B: 1 2

INFORMATION PROCESSOR

CLAIM OF PRIORITY

The present application claims priority from Japanese patent application JP 2012-130641 filed on Jun. 8, 2012, the content of which is hereby incorporated by reference into this application.

BACKGROUND OF THE INVENTION

1. Field of the Invention

The present invention relates to an information processor, and more particularly, to an information processor being suited for processing large graph data.

2. Description of the Related Art

In an information processor, the response time to a data request in data processing can be shortened significantly by previously loading required data into memory having high response speed before the CPU (host system) of a computer performs data processing. Conventionally, in the case of shortening the response time for data access in data processing, a method has been used in which, while a host system performs data processing, the controller of a storage device transfers only the data to be requested next by the host system from a non-volatile memory inside the storage device to a cache memory inside the storage device beforehand (refer to JP-T-2009-539168 (Patent Document 1)).

When large data is processed, for example, when a large graph is processed, a host for performing graph processing is required to control a large memory space and to store large graph data in the memory space. Hence, a main memory being large and operating at high speed is required to process a large graph at high speed.

Hence, the inventors of the present application examined related art in which all the memory chips used in a main memory are DRAM chips and also examined a method in which such a storage device as disclosed in Patent Document 1 is used as a main memory.

In the related art in which all the memory chips used in a main memory are DRAM chips, the CPU of a host for performing graph processing first downloads graph data to be processed from an external storage device or creates a graph and stores the graph into DRAM chips disposed in a memory space. Hence, in the case that graph data being large in data size is processed, it is necessary to mount DRAM chips serving as a main memory to the extent that the total storage capacity of the DRAM chips is sufficient to store the graph data.

However, a graph processing system in which DRAM chips are mounted on a large scale is expensive.

For this reason, it is conceivable to employ a method in which memory chips more inexpensive than DRAM chips are used to build a graph processing system at low cost.

A large and inexpensive memory space can be provided by disposing such a storage device as disclosed in Patent Document 1 in a memory space. However, in the case that graph processing is performed at high speed, this method has the following problems.

In the case that such a storage device as disclosed in Patent Document 1 is disposed in a memory space and graph processing is performed, the CPU of a host for performing the graph processing first downloads the graph data to be processed from an external storage device or creates graph data and stores the graph data into the storage device disposed in the memory space.

Then, the CPU performs graph processing using the graph data stored inside the storage device. The controller of the storage device loads the data into the host and then transfers only the graph data to be required next from the non-volatile memory inside the storage device to the cache memory inside the storage device while the host system performs the graph processing.

However, since the storage device is disposed in the memory space, the host obtains the graph data to be required next in the graph processing from the cache memory of the CPU of the host in some cases. In this case, the graph data having been transferred beforehand by the controller of the storage device into the cache memory inside the storage device is not requested by the host. Hence, when data is requested from the host to the storage device next time, the requested data does not exist in the cache memory inside the storage device. For this reason, the data is required to be readout from the non-volatile memory inside the storage device and to be returned to the host.

Furthermore, even in the case that the data requested by the host to the storage device does not coincide with the data stored in the cache memory of the CPU of the host but coincides with the data having been transferred beforehand from the non-volatile memory inside the storage device to the cache memory inside the storage device, it is conceivable that the host results in requesting the data to the storage device before the graph data to be required next by the host is completely transferred from the non-volatile memory inside the storage device to the cache memory inside the storage device because the time for data processing performed by the host is generally short in graph processing. Hence, also in this case, the data is required to be readout from the non-volatile memory inside the storage device and to be returned to the host.

Since the time required for reading out data from the non-volatile memory is longer than the time required for reading out the data from the DRAM, in the case that such a technology as disclosed in Patent Document 1 is used, there arises a problem that the time required for subjecting the data to graph processing becomes very long.

As described above, in the information processor adopting the conventional technology, when a large graph is processed, there arises a problem that a memory space being inexpensive and large cannot be provided or high-speed access to graph data cannot be achieved.

Accordingly, an object of the present invention is to provide an information processor capable of solving the above-mentioned problems encountered in the conventional technology and having main memory being suited for large data processing, being low in cost and large in capacity, and operating at high speed.

SUMMARY OF THE INVENTION

A representative aspect of the invention to be disclosed by the present application will be described below.

The present invention provides an information processor including an information processing sub-system and a memory sub-system performing data communication with the information processing sub-system, wherein the information processing sub-system has an information processing circuit for processing a graph according to graph processing instructions; the memory sub-system has a first memory, a second memory, a third memory having reading and writing latencies longer than those of the first memory and the second memory, and a memory controller for controlling data transfer among the first memory, the second memory and the third memory; in graph data to be subjected to the processing of the graph, to each of the vertices of the graph, an ID for uniquely specifying each of the vertices is assigned, and in the case that the ID assigned to one of the vertices is known, it is possible to specify where the IDs of other vertices relating to the vertex are located in an address space, and the graph data has a plurality of data blocks; the data block is all data or part of the data corresponding to an address identified by analyzing the ID of the one vertex using the memory controller, and at least the ID of the one vertex is recorded therein; the memory controller has a function of storing the graph data to be processed into the third memory and a preloading function of transferring the plurality of data blocks from the third memory to the first memory or the second memory; by using the preloading function, the memory controller autonomously analyzes the ID of at least one vertex included in one data block A of the data blocks, calculates the address of at least one data block B to be required next by the information processing circuit, and transfers the data block B from the third memory to the first memory or the second memory, and then analyzes the ID of at least one vertex included in the data block A or block B transferred previously from the third memory to the first memory or the second memory or included in a data block C different from the data blocks A and B, calculates the address of at least one data block D to be required next by the information processing circuit, and transfers the data block D from the third memory to the first memory or the second memory, and then similarly transfers a plurality of data blocks from the third memory to the first memory or the second memory; and the information processing circuit reads out the graph data from the first memory or the second memory different from the transfer destination of the data block in which the preloading function is being executed, and executes the processing of the graph data according to the processing instructions.

With the present invention, a large memory space required for processing a large graph and capable of achieving high-speed access to graph data can be provided at low cost. Furthermore, even in that case, graph processing can be performed at a speed similar to that in the case that graph data is stored in memory chips having short reading and writing latencies.

BRIEF DESCRIPTION OF THE DRAWINGS

FIG. 7 is an explanatory view showing a CSR format, an example of a data format of a graph to be handled by the server according to the first embodiment;

FIG. 17 is a schematic view for comparing a state in which the addresses of data to be required are derived with a data processing state in which the sequence of the addresses of data to be required have been determined beforehand;

DESCRIPTION OF EMBODIMENTS

Figure 1:
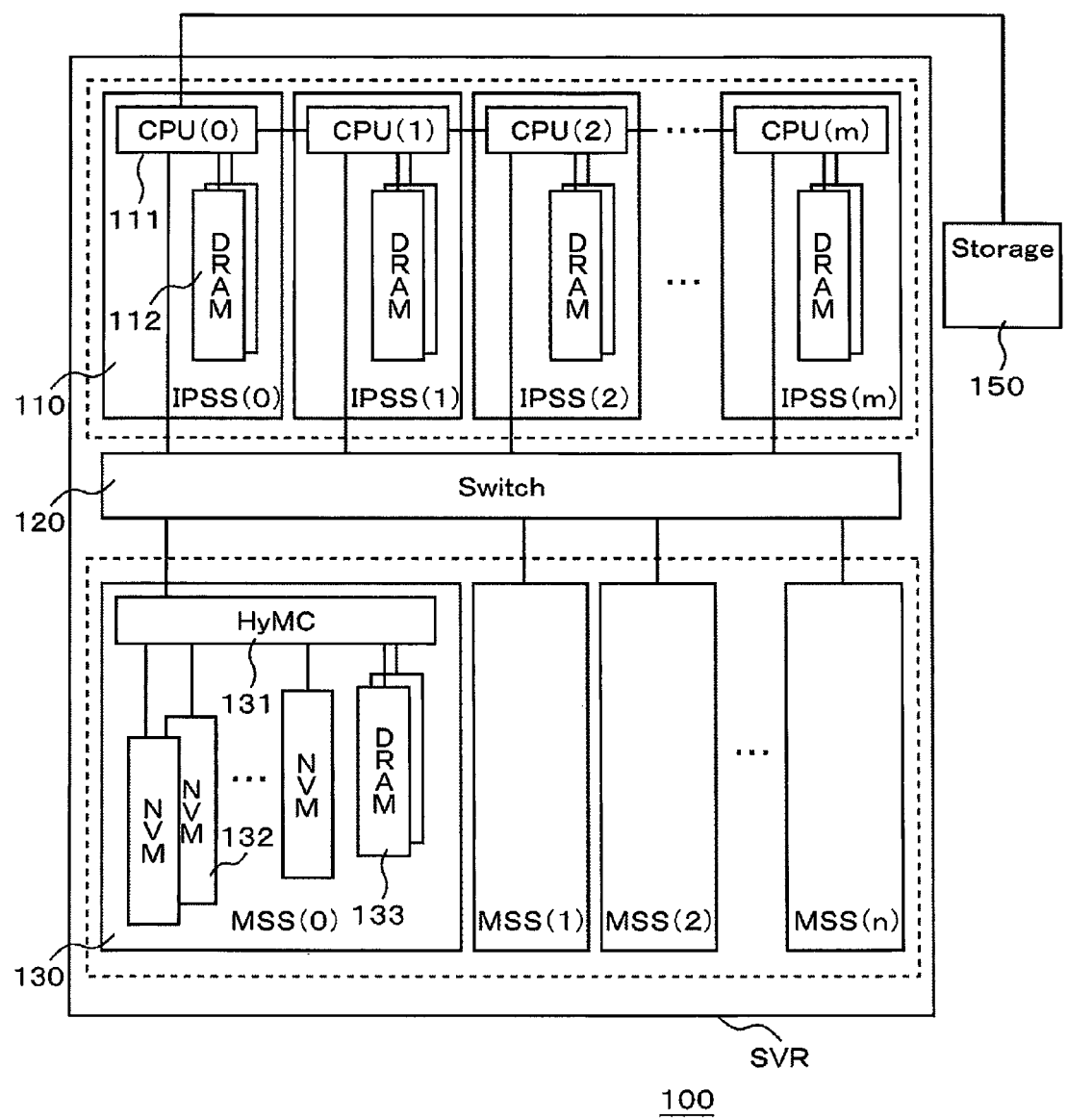
FIG. 1 is a configuration view showing an example of the overall configuration of a server to which a first embodiment according to the present invention is applied.

An information processor according to a representative embodiment of the present invention includes an information processing sub-system and a memory sub-system performing data communication with the information processing sub-system, wherein the information processing sub-system has an information processing circuit for processing a graph according to graph processing instructions; the memory sub-system has a first memory, a second memory, a third memory having reading and writing latencies longer than those of the first memory and the second memory, and a memory controller for controlling data transfer among the first memory, the second memory and the third memory; in graph data to be subjected to the processing of the graph, to each of the vertices of the graph, an ID for uniquely specifying each of the vertices is assigned, and in the case that the ID assigned to one of the vertices is known, it is possible to specify where the IDs of other vertices relating to the vertex are located in an address space, and the graph data has a plurality of data blocks; the data block is all data or part of the data corresponding to an address identified by analyzing the ID of the one vertex using the memory controller, and at least the ID of the one vertex is recorded therein; the memory controller has a function of storing the graph data to be processed into the third memory and a preloading function of transferring the plurality of data blocks from the third memory to the first memory or the second memory; by using the preloading function, the memory controller autonomously analyzes the ID of at least one vertex included in one data block A of the data blocks, calculates the address of at least one data block B to be required next by the information processing circuit, and transfers the data block B from the third memory to the first memory or the second memory, and then analyzes the ID of at least one vertex included in the data block A or block B transferred previously from the third memory to the first memory or the second memory or included in a data block C different from the data blocks A and B, calculates the address of at least one data block D to be required next by the information processing circuit, and transfers the data block D from the third memory to the first memory or the second memory, and then similarly transfers a plurality of data blocks from the third memory to the first memory or the second memory; and the information processing circuit reads out the graph data from the first memory or the second memory different from the transfer destination of the data block in which the preloading function is being executed, and executes the processing of the graph data according to the processing instructions.

A first embodiment according to the present invention will be described below in detail referring to the accompanying drawings.

The information processor according to this embodiment includes information processing sub-systems, memory sub-systems, and a network switch for connecting these. The information processing sub-systems include a plurality of information processing circuits (CPU) and DRAM chips connected to each information processing circuit (CPU). The memory sub-system, connected to each information processing circuit (CPU), includes a first memory, a second memory, a third memory, and a memory controller for controlling the transfer of graph data among the first memory, the second memory and the third memory. The reading and writing latencies of the third memory are longer than those of the first memory and the second memory.

The third memory stores graph data, and the memory controller analyzes one data block A serving as part of the graph data read out from the third memory. On the basis of the result of the analysis, the memory controller transfers the next one data block B serving as part of the graph data to be required for the execution of the graph processing from the third memory to the first memory, and then analyzes the data block A or B preloaded previously or a data block C different from the data blocks A and B. On the basis of the result of the analysis, the memory controller transfers the next data block D of the graph data to be required for the execution of the graph processing from the third memory to the first memory, and then similarly transfers a plurality of data blocks from the third memory to the first memory. Each of the information processing circuits (CPU) executes a program and reads out the graph data transferred to the second memory via the network switch.

In this embodiment, DRAM chips are used as the first memory and the second memory of the present invention, and a non-volatile memory is used as the third memory. A server SVR in which a plurality of CPUs execute graph processing programs and an information processing system IPS in which a graph processing program is executed in one CPU are taken as examples and described.

<A. Configuration of Server>

First, the configuration of the server (SVR) 100 according to the first embodiment to which the information processor according to the present invention is applied will be described referring to FIGS. 1 and 2.

FIG. 1 shows an example of the configuration of the server (SVR) 100 according to the first embodiment to which the present invention is applied. The server (SVR) 100 includes a plurality of information processing sub-systems IPSS (IPSS(0) to IPSS(m)) 110, a network switch (Switch) 120 connected to all of them, and a plurality of memory sub-systems MSS (MSS(0) to MSS(n)) 130. The server (SVR) 100 is connected to an external storage device (Storage) 150 via a communication network. In the above, m and n are natural numbers. The server (SVR) 100 has input/output means (not shown), such as a keyboard and a display, as user interfaces.

Each of components constituting the server 100 according to the first embodiment will be described below.

Each of the information processing sub-systems IPSS 110 includes an information processing circuit (CPU) 111 and DRAM chips 112 connected to the information processing circuit (CPU). The information processing circuits (CPUs) constituting the information processing sub-systems IPSS(0) to IPSS(m) are respectively represented by information processing circuits CPU(0) to CPU(m). One or more DRAM chips 112 are connected to each of the information processing circuits CPU(0) to CPU(m), and data communication is performed between each information processing circuit and the DRAM chips connected thereto.

The respective information processing circuits CPU(0) to CPU(m) are connected to one another directly or via the network switch 120, and data communication is performed with one another. All the information processing circuits (CPU(0) to CPU(m)) 111 are connected to all the memory sub-systems MSS (MSS(0) to MSS (n)) 130 via the network switch 120, and data communication can be performed with one another.

The information processing circuit CPU(0) has a graph processing program (a graph operation processing function) as in the case of the other information processing circuits CPU(1) to CPU(m). In addition, the information processing circuit CPU(0) supervises the information processing of the respective information processing circuits CPU(0) to CPU (m). The information processing circuit CPU(0) is connected to the external storage device 150, and data communication is performed with each other.

In other words, the information processing circuit CPU(0) is equipped with, as inherent functions (programs), a function of accepting specifications relating to graph processing via the user interfaces; a function of taking data to be required for performing the graph operation processing of the accepted specifications from the external storage device 150 to the server; a function of distributing graph operation processing tasks to the respective information processing circuits CPU (0) to CPU(m) so that the tasks are processed by them; a function of supplying data to be required for the graph operation processing to the respective information processing circuits CPU(0) to CPU(m); a function of collecting the results of the graph processing subjected to the distributed processing, recording the results into the external storage device 150 and outputting the results via the user interfaces, etc.

The memory sub-systems MSS(0) to MSS(n) are connected to one another via the network switch 120, and data communication can be performed with one another. In addition, each of the memory sub-systems MSS(0) to MSS(n) includes a memory controller HyMC 131, one or more non-volatile memory NVM chips 132, and one or more DRAM chips 133. This memory controller HyMC 131 performs data communication between the memory controller HyMC and the non-volatile memory NVM chips 132 and between the memory controller HyMC and the DRAM chips 133.

Figure 2:
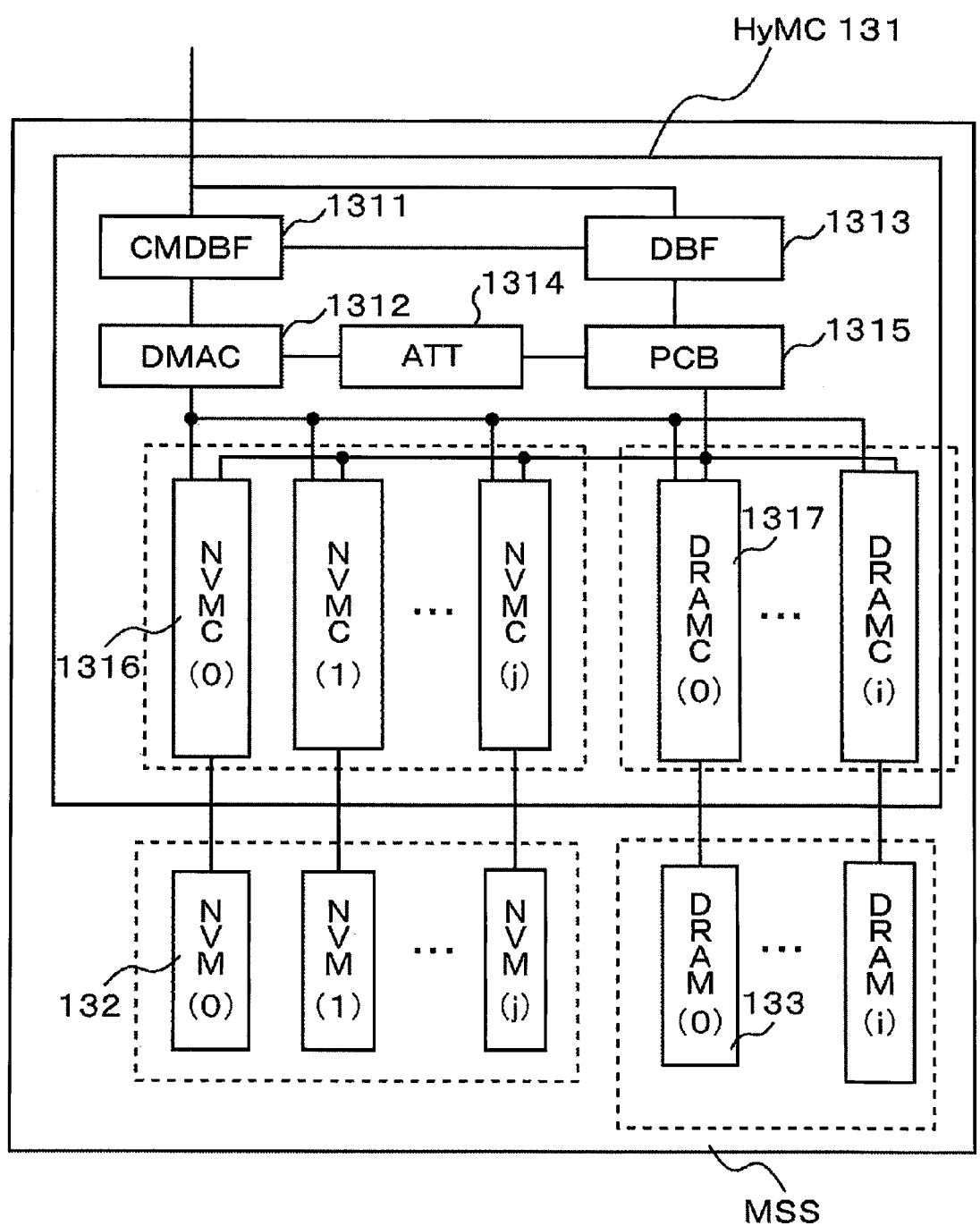
FIG. 2 is a configuration view showing an example of the configuration of a memory sub-system inside the server shown in FIG. 1.

FIG. 2 shows a detailed configuration of each memory sub-system MSS 130 constituting the server SVR 100 shown in FIG. 1.

The memory sub-system MSS 130 includes the memory controller HyMC 131, the non-volatile memory chips NVM (NVM(0) to NVM(j)) 132 and the DRAM chips (DRAM(0) to DRAM(i)) 133. In the above, i and j are natural numbers.

The memory controller HyMC 131 includes a command data buffer CMDBF 1311, a memory access control circuit DMAC 1312, a data buffer DBF 1313, an address translation table ATT 1314, a preload control block PCB 1315, non-volatile memory control circuits NVMC (NVMC(0) to NVMC(j)) 1316, and DRAM control circuits DRAMC (DRAMC(0) to DRAMC(i)) 1317. The respective components will be described below.

The command data buffer CMDBF 1311 is connected to the information processing circuits CPU(0) to CPU(m) and the other memory sub-systems shown in FIG. 1 via the network switch 120, and data transfer is performed with one another among them. The command data buffer CMDBF 1311 is connected to the memory access control circuit DMAC 1312 and the data buffer DBF 1313, and data communication is performed with one another among them.

The data buffer DBF 1313 is connected to the information processing circuits CPU(0) to CPU(m) and the other memory sub-systems shown in FIG. 1 via the network switch 120, and data transfer is performed with one another among them. The data buffer DBF 1313 is connected to the command data buffer CMDBF 1311 and the preload control block PCB 1315, and data communication is performed with one another among them.

The memory access control circuit DMAC 1312 is connected to the command data buffer CMDBF 1311, the address translation table ATT 1314, the non-volatile memory control circuits NVMC(0) to NVMC (j) 1316 and the DRAM control circuits DRAMC(0) to DRAMC(i) 1317, and data communication is performed with one another among them.

The address translation table ATT 1314 is connected to the memory access control circuit DMAC 1312 and the preload control block PCB 1315, and data communication is performed with one another among them.

The preload control block PCB 1315 is connected to the data buffer DBF 1313, the address translation table ATT 1314, the non-volatile memory control circuits NVMC(0) to NVMC(j) 1316 and the DRAM control circuits DRAMC(0) to DRAMC(i) 1317, and data communication is performed with one another among them.

The non-volatile memory control circuits NVMC(0) to NVMC(j) 1316 are respectively connected to the non-volatile memory chips NVM (0) to NVM(j) 132 and read out data from the non-volatile memory chips and write data into the non-volatile memory chips. In addition, the non-volatile memory control circuits NVMC(0) to NVMC(j) 1316 are connected to the memory access control circuit DMAC 1312 and the preload control block PCB 1315, and data communication is performed among them.

The DRAM control circuits DRAMC(0) to DRAMC(i) 1317 are respectively connected to the DRAM(0) to DRAM (i) 133, read out data from the DRAM chips 133 and write data into the DRAM chips. The DRAM control circuits DRAMC(0) to DRAMC(i) 1317 are connected to the memory access control circuit DMAC 1312 and the preload control block PCB 1315, and data communication is performed among them.

<B. Configuration of Information Processing System>

Next, an information processing system IPS according to the embodiment to which the information processor of the present invention is applied will be described referring to FIGS. 3 and 4.

Figure 3:
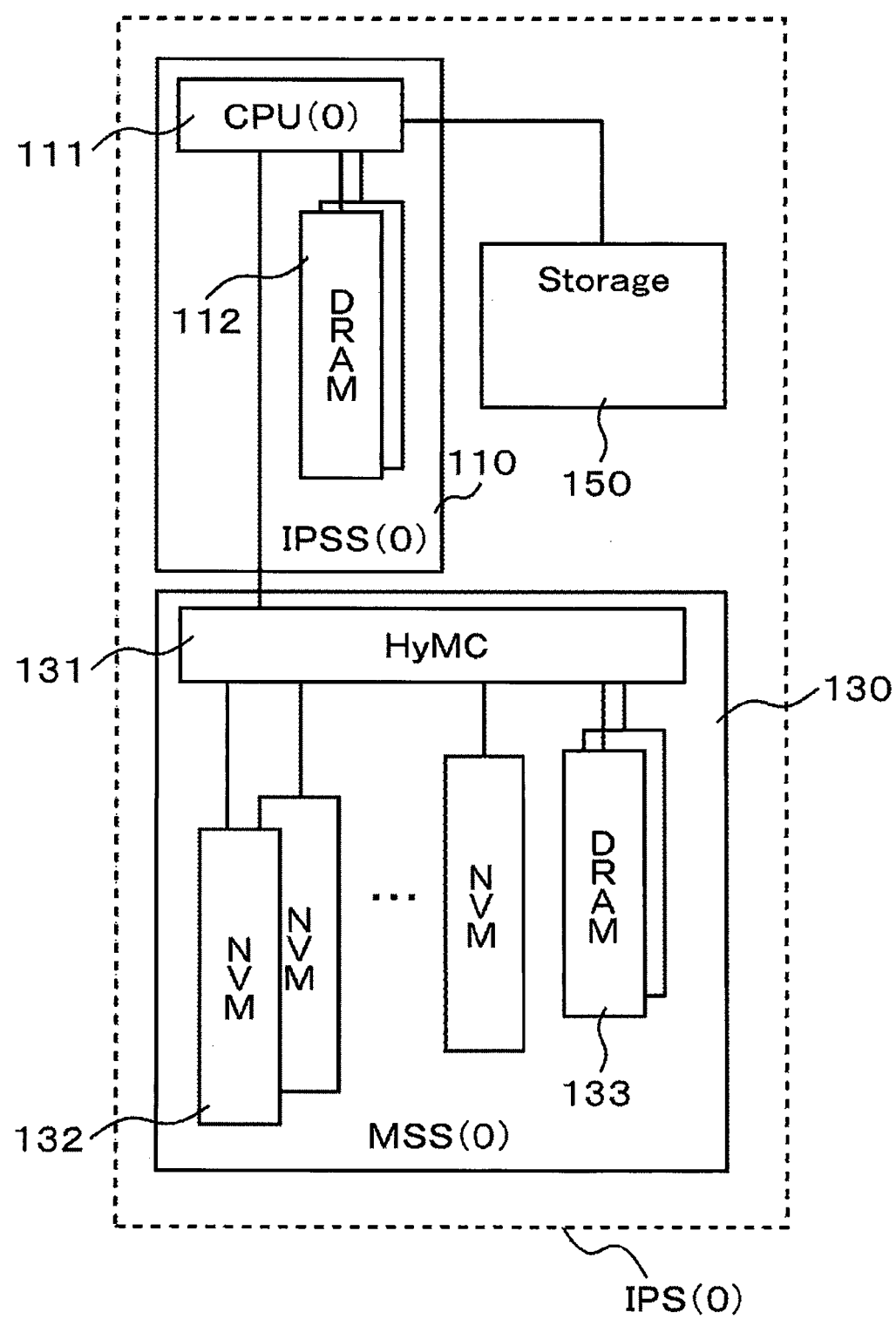
FIG. 3 is a configuration view showing an example of the overall configuration of an information processing system to which an embodiment according to the present invention is applied.

FIG. 3 shows an information processing system IPS(0) 200 including an information processing sub-system IPSS 110 and one memory sub-system MSS 130 connected thereto, and also shows an external storage device 150, as an example of the information processing system. Each of them will be described below.

The internal configuration of the information processing sub-system IPSS(0) 110 is the same as the internal configuration of the information processing sub-system in the configuration of the server. The information processing sub-system IPSS(0) 110 is connected to a memory sub-system MSS (0) 130, and data communication can be performed with each other. The information processing circuit CPU(0) 111 is connected to the external storage device 150, and data communication is performed with each other. The internal configuration of the memory sub-system MSS(0) 130 is the same as the internal configuration of the memory sub-system in the configuration of the server.

Figure 4:
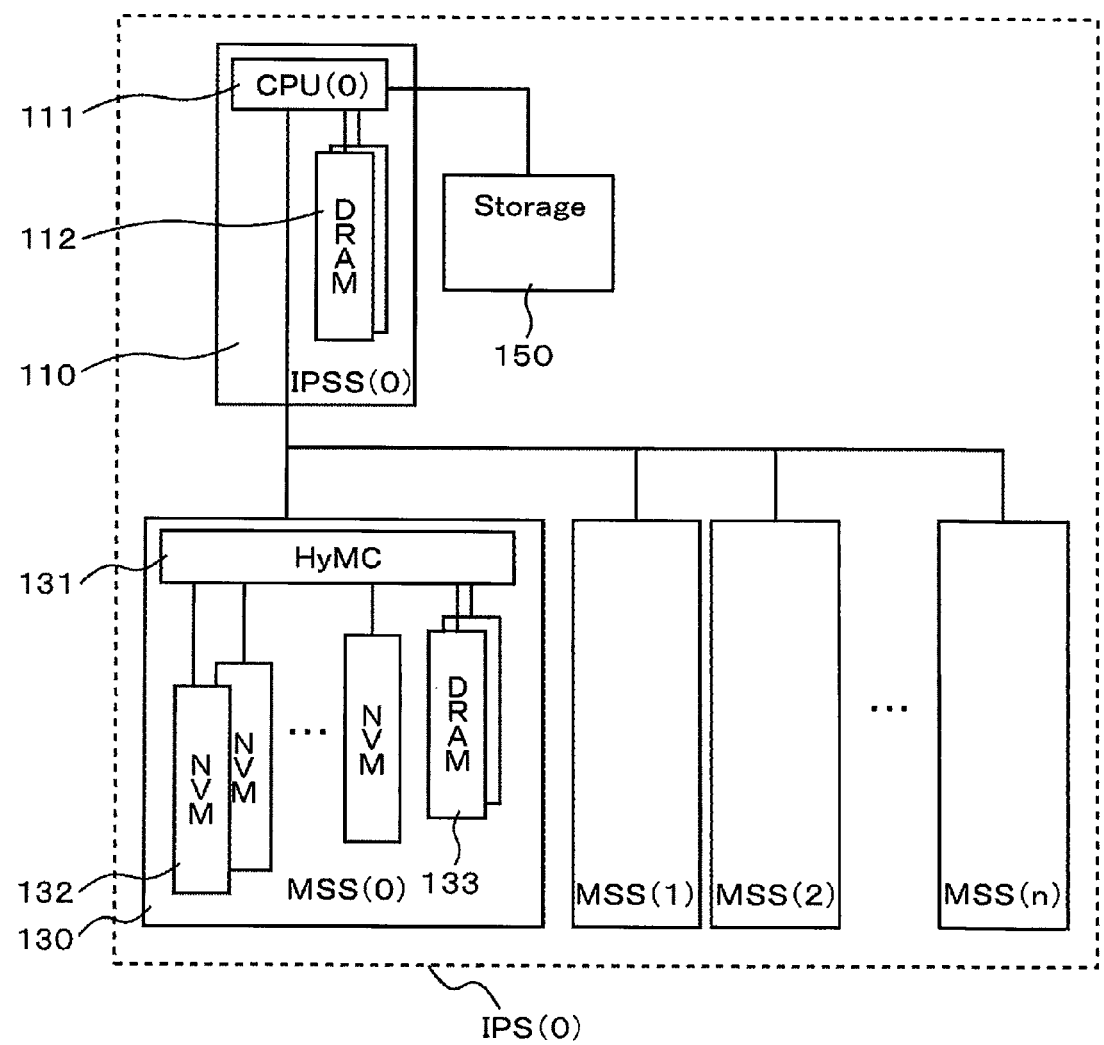
FIG. 4 is a configuration view showing another example of the overall configuration of the information processing system to which the embodiment according to the present invention is applied.

As another example of the information processing system, FIG. 4 shows an information processing system IPS(0) 210 including an information processing sub-system IPSS(0) 110 and a plurality of memory sub-systems MSS(0) to MSS(n) 130 connected thereto and also shows an external storage device 150. Each of them will be described below.

The internal configuration of the information processing sub-system IPSS(0) 110 is the same as the internal configuration of the information processing sub-system in the configuration of the server. The information processing sub-system IPSS(0) 110 is connected to the memory sub-systems MSS(0) to MSS(n) 130 via a network switch, and data communication can be performed with one another. The information processing circuit CPU(0) 111 is connected to the external storage device 150, and data communication is performed with each other. The internal configuration of each of the memory sub-systems MSS(0) to MSS(n) 130 is the same as the internal configuration of the memory sub-system in the configuration of the server.

The functions and operations of the server according to the first embodiment to which the present invention is applied will be described below by taking examples.

First, an example of a graph to be handled by the server of the present invention and an example of the data format of the data of the graph will be described referring to FIGS. 5 to 7.

<C. Graph and Data Format of Graph Data>

Figure 5:
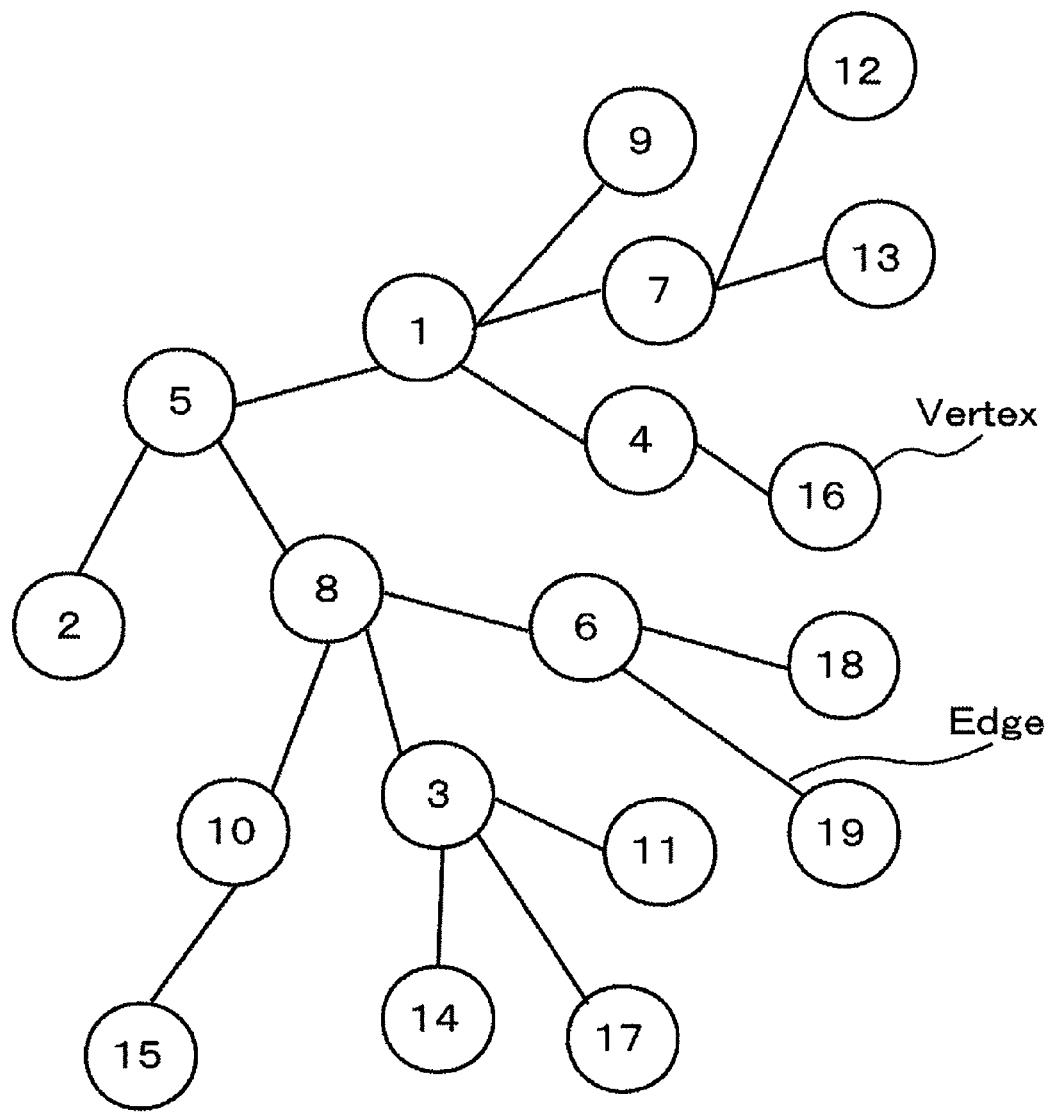
FIG. 5 is an explanatory view showing an example of a graph to be handled by the server according to the first embodiment.

FIG. 5 is a view showing an example of a graph to be handled by the server.

To a graph to be taken herein as an example, numbers for uniquely specifying the respective vertices of the graph are assigned, and the respective two vertices have one of two kinds of relationships, in other words, they are directly connected to each other using one graph edge or not connected to each other.

Figure 6:
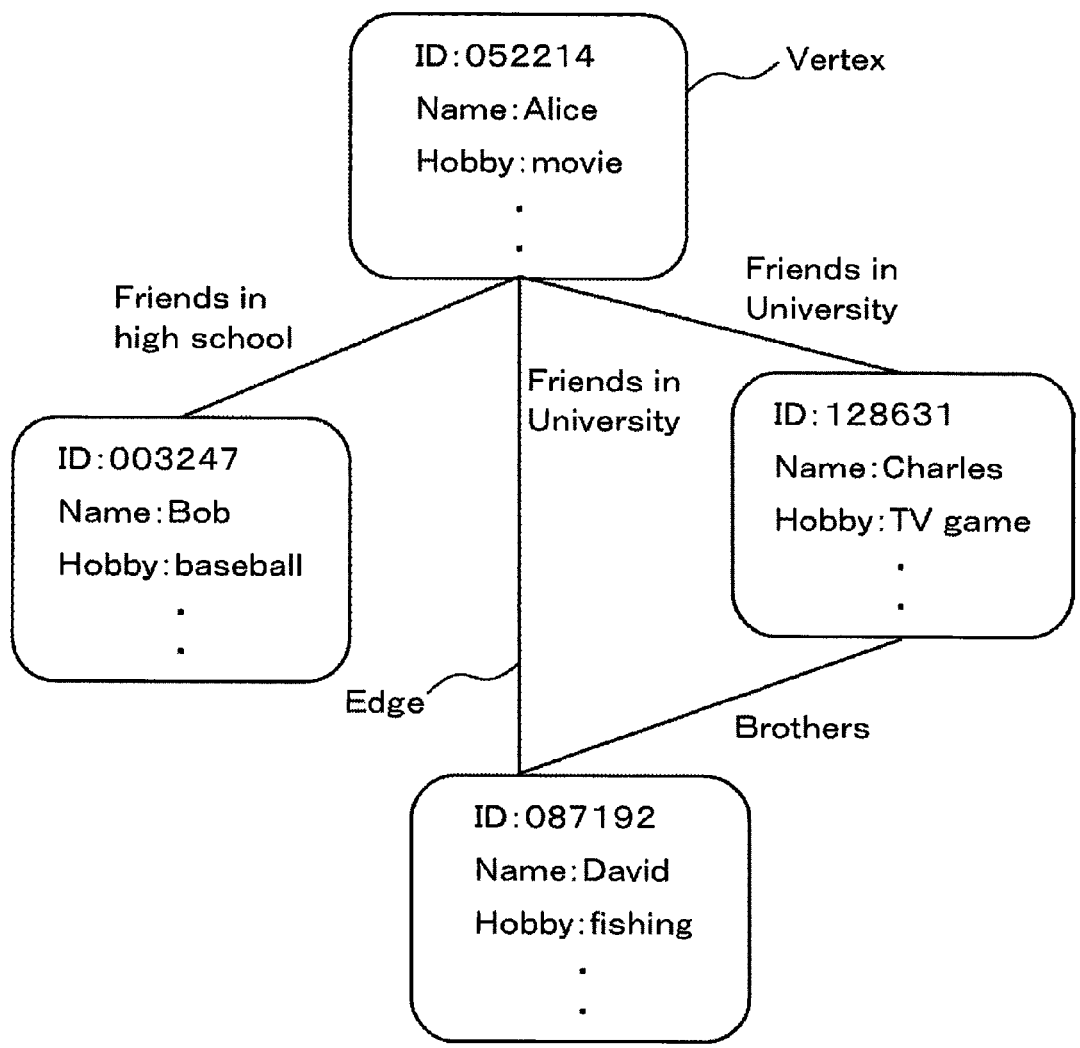
FIG. 6 is an explanatory view showing another example of a graph to be handled by the server according to the first embodiment.

As shown in FIG. 6, more generally speaking, a graph that can be handled by the server should only be a graph in which information for uniquely specifying a vertex is added to each vertex of the graph, and the number of the relationships is not limited to two.

In the example shown in FIG. 6, each vertex represents each user of a social network. Information for uniquely specifying a vertex is the ID, name, hobby, etc. of the user, and kinds of relationships are those among friends in high school, friends in university, brothers, etc.

Next, an example of the data format of graph data to be handled in the server will be described.

FIG. 7 shows a CSR (Compressed Sparse Row) format, one data format capable of representing the connection between two vertices in the graph shown in FIG. 5. In the CSR format, graph data is represented by an array A and an array B. The array A is an array in which the vertex numbers of the respective vertices connected are arranged in the sequence of the vertex numbers. The array B represents the switching positions of the vertex numbers in the array A.

The graph shown in FIG. 5 will be taken as an example and described below.

First, in the graph shown in FIG. 5, the vertex numbers of the vertices connected to the vertex 1 are 4, 5, 7 and 9. Hence, 4, 5, 7 and 9 are stored in the beginning of the array A shown in FIG. 7. After these numerals, vertex number 5 of the vertex connected to vertex 2 is stored. Furthermore, in the case that only the array A in which vertex numbers 4, 5, 7, 9 and 5 are written is used, the location in which the vertex number of the vertex connected to the vertex 1 is switched to the vertex number of the vertex connected to the vertex 2 is unknown. Hence, position 1 in which the vertex number of the vertex connected to the vertex 1 starts in the array A and position 5 in which the vertex number of the vertex connected to the vertex 2 starts in the array A are stored in the array B.

In the case that the array A and the array B are created on the basis of the rule described above, the arrays shown in FIG. 7 are obtained. The partial regions of the array A represented by a, b, c, . . . written above the array A sequentially indicate regions in which the vertex numbers of the vertices connected to the vertices 1, 2, 3, . . . are shown.

The data format of graph data to be handled in the server is not limited to the CSR format. As other data formats, an adjacency matrix format, a linked list format, a data format in which information relating to the type or intensity of connection in addition to information relating to vertices is stored are taken as examples.

The data format of graph data to be handled in the server is generally defined by the following rules. However, in the case that graph data is written in the data format satisfying at least rule (1), the present invention is applicable.

(1) In the case that an ID for uniquely specifying each vertex is assigned to each vertex and that the ID assigned to the vertex is known, it is possible to specify where the IDs of other vertices relating to the vertex are located in an address space.

(2) In the case that an ID for uniquely specifying each vertex is known, it is possible to specify where information associated with the vertex is located in the address space.

(3) An ID capable of uniquely representing the kind of relationship of the connection between the respective vertices can be assigned, and the intensity of the relationship can be represented numerically.

(4) In the case that IDs assigned to vertices are known, it is possible to specify where information relating to the kind and intensity of relationship shared by the vertices is located in the address space.

(5) In the case that an ID uniquely representing the kind of relationship is known, it is possible to specify where information associated with the relationship is located in the address space.

Figure 8:
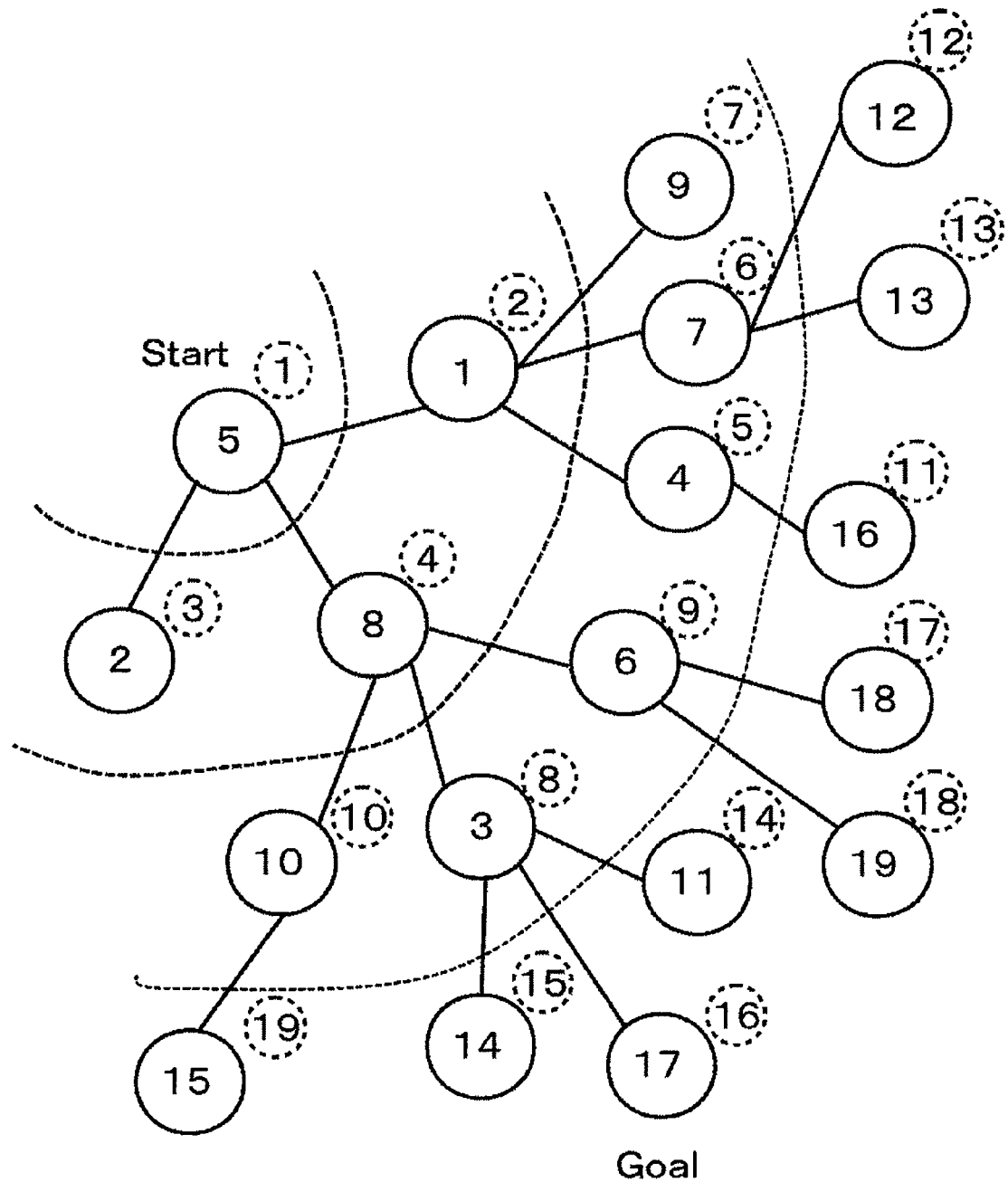
FIG. 8 is an explanatory view showing a sequence of referring to graph data to be handled by the server according to the first embodiment in breadth-first search serving as an example of a graph processing algorithm.

Next, an example of a graph processing algorithm to be handled in the server will be described referring to FIG. 8. FIG. 8 is an explanatory view showing a sequence of referring to graph data in breadth-first search serving as an example of a graph processing algorithm.

<D. Flow of Graph Processing Algorithm>

As an example of a graph processing algorithm, a case in which a problem of obtaining the shortest path on a graph from a graph vertex to another graph vertex on the graph is processed using a breadth-first search algorithm is taken.

It is herein assumed that the graph shown in FIG. 5 is stored in the CSR format shown in FIG. 7.

The user of the server, wanting to perform graph processing, gives information for specifying two vertices for the shortest path, that is, the start and the goal of the path, to the information processing circuit CPU(0) shown in FIG. 1 via a user interface, such as a keyboard. Then, the information processing circuit CPU(0) refers to graph data in the following sequence according to the breadth-first search algorithm and proceeds with graph processing. In the following graph processing, the information processing circuit CPU(0) properly allows the processing to be shared and allocated among the respective information processing circuits CPU(1) to CPU(m) as necessary on the basis of the amount of calculation and other factors in the graph processing. In other words, the CPU(0) supervises the entire graph processing, and the respective CPUs (the information processing circuits CPU(0) to CPU(m)) including the CPU(0) proceed with the graph processing.

As shown in FIG. 8, it is herein assumed that the start (Start) of the path is vertex 5 and that the goal (Goal) is vertex 17. First, the information processing circuit CPU(0) instructs one of the information processing circuits CPU(0) to CPU(m) to refer to the fifth and sixth elements of the array B. It is assumed that the information processing circuit to which the instruction is given is the CPU(1). The CPU(1) refers to the fifth and sixth elements of the array B and knows that the vertex numbers of the vertices connected to vertex 5 are written in the elements (in a region e) from the 12th element to the 14th element of the array A shown in FIG. 7. The region e is referred to as one data block. Generally speaking, a data block is all data or part of data corresponding to an address identified by analyzing the ID of one vertex. In the case of graph data written in the CSR format, however, a data block is information in which the vertex numbers of vertices connected to one vertex are stored. As a result, the CPU(1) instructs one of the information processing circuits CPU(0) to CPU(m) to refer to the region e of the array A via the information processing circuit CPU(0) as necessary. It is assumed that the information processing circuit to which the instruction is given is the CPU(2). The CPU(2) refers to the region e of the array A and knows that the vertex numbers of the vertices connected to vertex 5 are 1, 2 and 8.

Next, the CPU(2) gives notice as necessary to the CPU(0) that vertex 5 has already been referred to, that the vertex numbers of the vertices to be referred to next are 1, 2 and 8, and that the vertex closer to the start by one vertex from vertices 1, and 8 is vertex 5. Furthermore, the CPU(2) stores the information into the information storage device (the DRAM or the memory sub-system shown in FIG. 1) connected to the CPU(0) or the CPU(2).

The CPU(0) or the CPU(2) refers to the vertex number of the vertex to be referred to next and instructs some of the CPUs to refer to the elements of the array B corresponding to vertices 1, 2 and 8. The following operation is shared and processed by some of the CPUs, and processing similar to the operation performed from the start vertex 5 is carried out.

The numbers enclosed by broken-line circles in FIG. 8 represent the sequence of the vertices to be subjected to data processing by the CPUs.

Hereafter, the array A and the array B are similarly referred to sequentially. When the vertex immediately ahead of the goal vertex 17 is referred to, the shortest path is found, and the execution of the algorithm is ended.

Although an example in which the problem of obtaining the shortest path using the breadth-first search method is taken, the graph processing algorithm to be handled in the server is not limited to the above-mentioned example, but includes the depth-first search method and the Dijkstra method in the shortest path search, the exponentiation method in page rank calculation, search and data extraction in a large database, etc.

For example, in the depth-first search, the sequence of vertices to be subjected to data processing is vertices 5, 1, 4, 16, 7, 13, 12, 9, 2, 8, 10, . . . as shown in FIG. 8.

The operation of the server at the time when the server performs graph processing will be described below referring to FIGS. 9 to 24.

<E. Operation of Server in Graph Processing>
(1) Outline of the Operation of the Server First, the outline of the operation of the server at the time when the server performs graph processing will be described referring to FIGS. 9 to 13. The details of respective operations will be described in items (2) to (6) described later.

The operation of the server includes graph data downloading operation, graph data preloading operation performed by the memory controller HyMC, graph data reading operation performed by the information processing circuit CPU, graph processing result writing operation, and preload optimizing operation. The outline of each operation will be described below briefly.

First, the graph data downloading operation in the server will be described. The information processing circuit CPU(0) first downloads all graph data (All data in FIG. 10) to be subjected to graph processing from the information storage device 150 disposed outside the server 100 via the respective information processing circuits CPU(0) to CPU(m) and the memory controller HyMC 131 and then writes the data in the non-volatile memory chips NVM 132 of the memory sub-systems MSS(0) to MSS(n) (data A and data B in FIG. 10).

Figure 9:
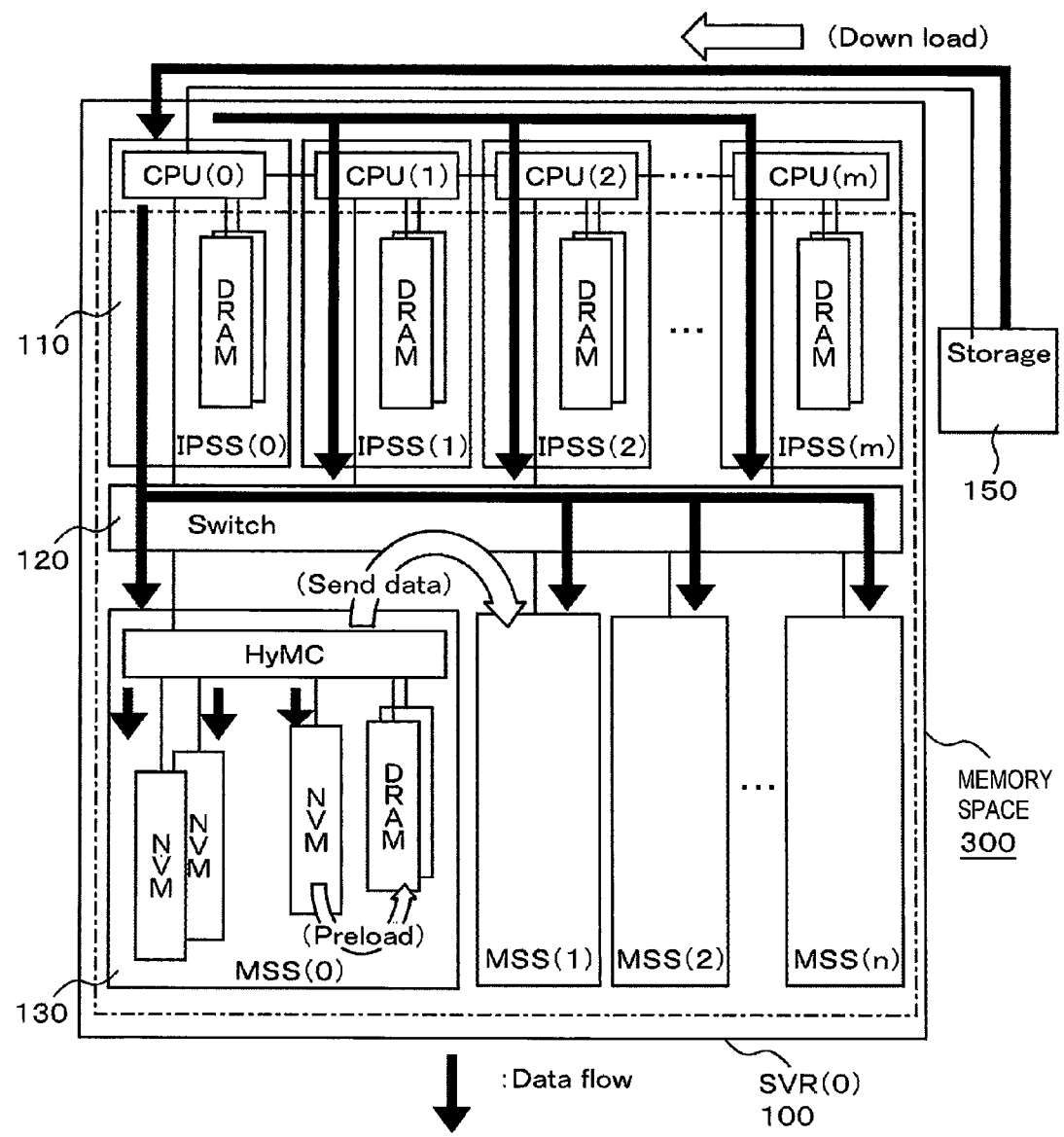
FIG. 9 is a view showing an example of the flow of data among respective information processing devices in the entire server at the time when graph data is downloaded.

The data flow at the time of the downloading is indicated by black arrows in FIG. 9. As shown in FIG. 9, the DRAM chips inside the IPSS 110 directly connected to the CPUs and the non-volatile memory chips NVM and the DRAM chips disposed inside the respective memory sub-systems MSS 130 are present in one memory space 300 controlled by the respective CPUs. The all graph data (All data) to be subjected to graph processing is downloaded from the information storage device 150 into the one memory space 300.

Next, the graph data preloading operation performed by the memory controller HyMC will be described referring to FIGS. 10 and 11.

After the downloading operation, each of the information processing circuits CPU first transmits data (Data 0 in FIG. 10) that is required for the memory controller HyMC 131 to autonomously calculate the address of the data to be required next in graph processing and also transmits an algorithm, etc. as necessary to the corresponding memory controller HyMC.

Next, the memory controller HyMC 131 for controlling the non-volatile memory chips NVM for storing the graph data including the start vertex processes the data received from the corresponding CPU (Cal 1 in FIG. 10) and obtains the address of the data block (Data 1 in FIG. 10) including vertex information to be required next by the CPU for graph processing. The data block is herein all data or part of data corresponding to the address found by analyzing one vertex number using the memory controller. The information of at least one vertex number is included in the data block. In other words, the method of dividing the data blocks depends on the data format of the graph data. Next, the memory controller reads out Data 1 from the non-volatile memory NVM 132 and transfers the data to the DRAM 133 inside the corresponding memory sub-system or to the DRAM 112 connected to the corresponding information processing circuit CPU (To M1 and To D1 in FIG. 10). This kind of graph data transfer operation is referred to as preloading operation.

Figure 11:
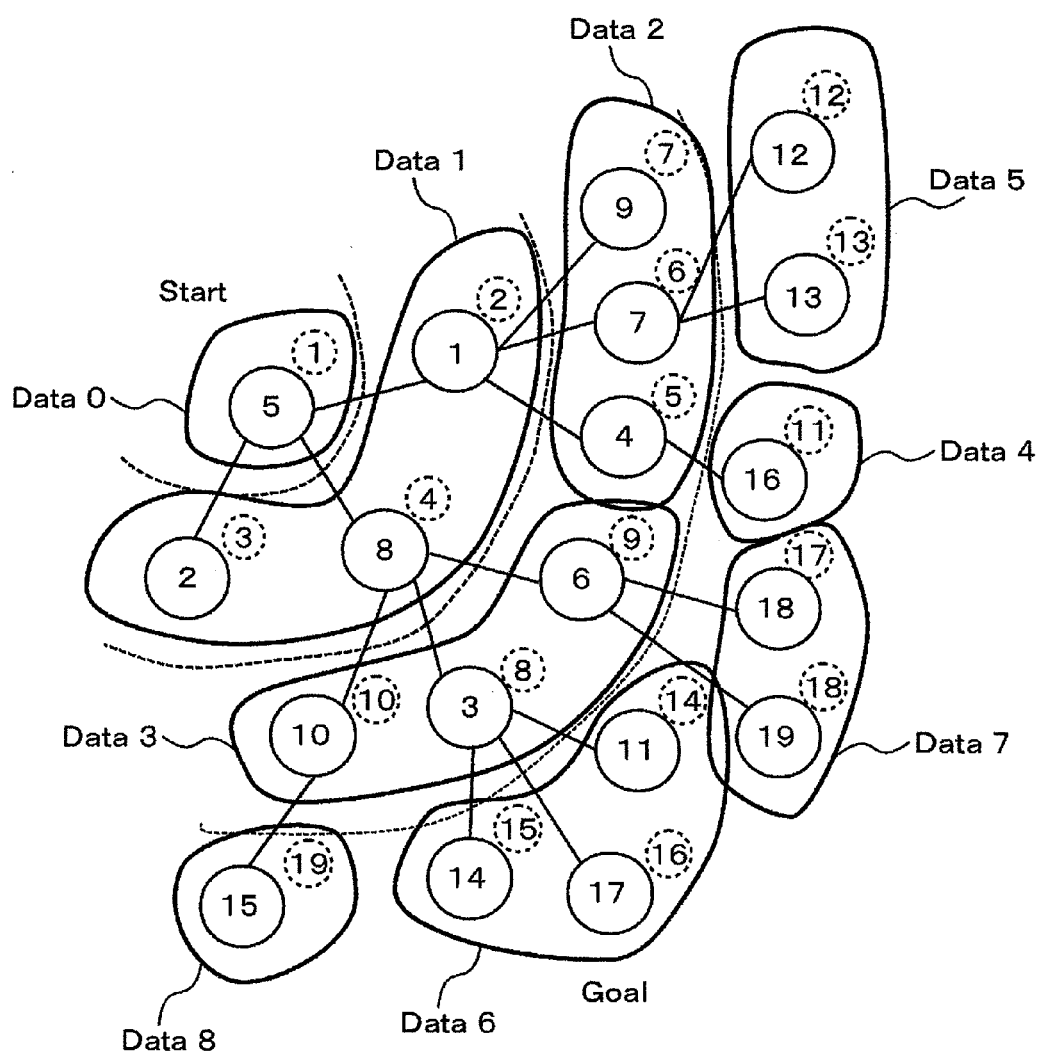
FIG. 11 is a schematic view showing divided graph data blocks in the graph data shown in FIG. 5.

In the graph data expressed in the CSR format shown in FIG. 7, when the data blocks (Data 0, Data 1, etc.) are represented on a graph, the data blocks are divided as shown in FIG. 11. The sequence according to which these data blocks are transferred from the non-volatile memory NVM 132 to the DRAM 133 by the preloading operation is dependent on the graph processing algorithm. The sequence is transmitted as necessary from the information processing circuit CPU to the memory controller HyMC before the start of the preloading operation performed by the memory controller.

For example, in the case that graph processing is performed using the breadth-first search algorithm, the memory controller HyMC 131 processes the data received from the corresponding CPU (Cal 1 in FIG. 10), autonomously analyzes the vertex number (number 1) of one vertex included in one data block (Data 1) of the non-volatile memory NVM 132, calculates the address of one data block (Data 2) to be required next by the information processing circuit CPU, and transfers this data block (Data 2) from the NVM 132 to one DRAM. Then, the memory controller analyzes the vertex numbers (numbers 2 and 8) of other vertices included in the data block (Data 1) transferred from the NVM 132 to the DRAM 133 previously, calculates the address of one data block (Data 3) to be required next by the information processing circuit, and transfers this data block (Data 3) from the NVM 132 to one DRAM. Similarly as described above, a plurality of data blocks are preloaded from the NVM 132 to one DRAM.

On the other hand, in the case that graph processing is performed using the depth-first search algorithm, the memory controller HyMC 131 processes the data received from the corresponding CPU (Cal 1 in FIG. 10), autonomously analyzes the vertex number (number 1) of one vertex included in one data block (Data 1) of the non-volatile memory NVM 132, calculates the address of one data block (Data 2) to be required next by the information processing circuit CPU, and transfers this data block (Data 2) from the NVM 132 to one DRAM. Then, the memory controller analyzes the vertex number (number 4) of the vertex included in the data block (Data 2), calculates the address of one data block (Data 4) to be required next by the information processing circuit, and transfers this data block (Data 4) from the NVM 132 to one DRAM. Similarly as described above, a plurality of data blocks are preloaded from the NVM 132 to one DRAM.

Furthermore, in the case that the data block Data 2 to be required next to Data 1 by the information processing circuit CPU is present in the non-volatile memory NVM controlled by another memory controller HyMC 131 in graph processing, the memory controller performs the below-mentioned operation to be carried out in the case that graph data extends over a plurality of the memory sub-systems, reads out Data 2 from the non-volatile memory NVM 132, and transfers Data 2 to the DRAM 133 inside the memory sub-system corresponding to Data 2 or to the DRAM 112 connected to the information processing circuit CPU (To M2 and To D2 in FIG. 10).

Similarly, each corresponding memory controller HyMC successively transfers the graph data blocks to be required when each of the information processing circuits CPU performs graph processing from the non-volatile memory NVM to the DRAM inside the memory sub-system or to the DRAM connected to the corresponding information processing circuit CPU.

Figure 10:
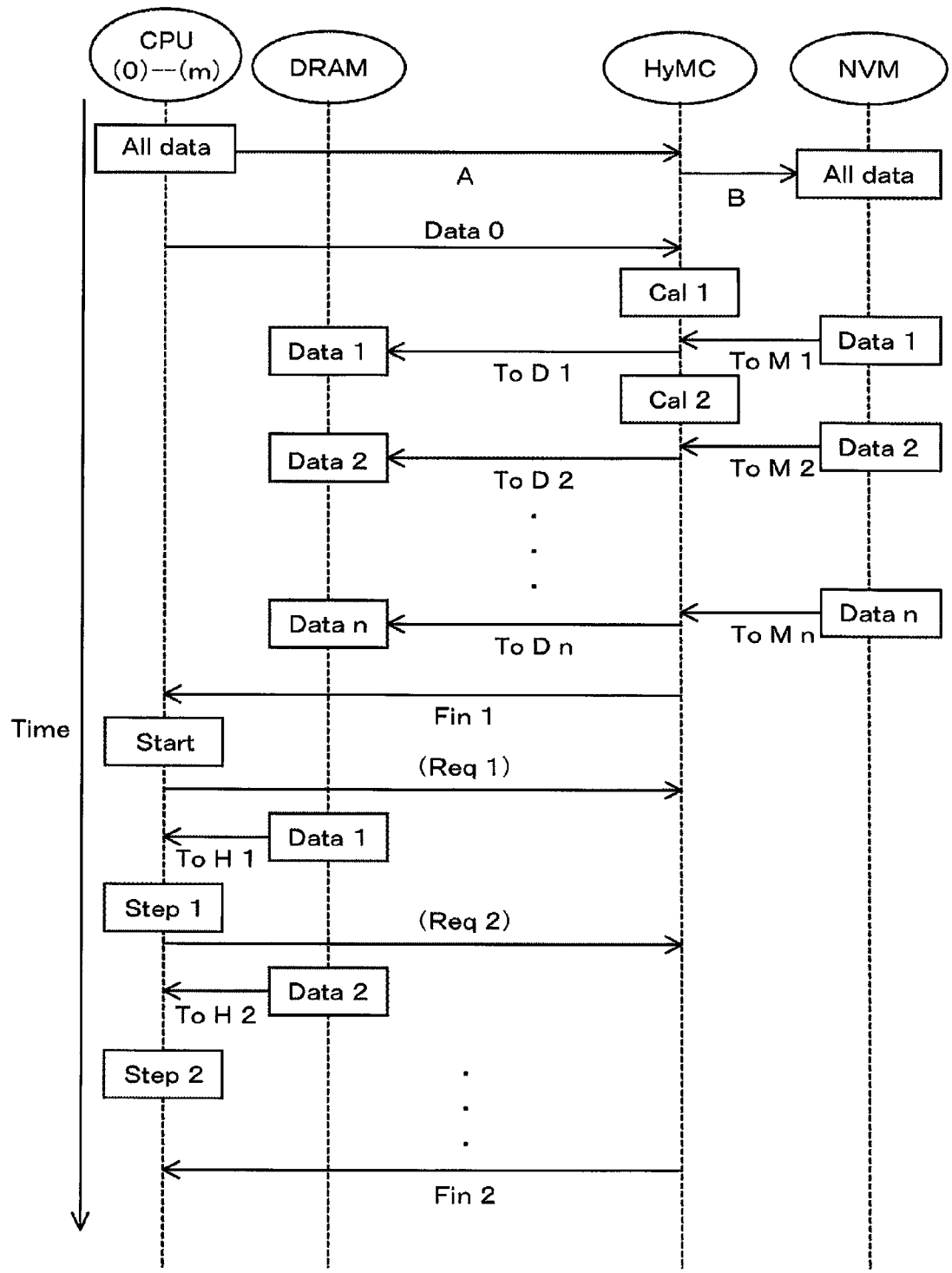
FIG. 10 is a schematic view showing the outline of the operation of respective components in graph processing in the server shown in FIG. 1.

When the amount of the data transferred from the non-volatile memory NVM 132 to the DRAM chips (133 and 122) reaches a certain amount (the transfer of the data up to Data n is ended), the memory controller HyMC gives notice to the information processing circuit CPU(0) that the amount of the preloaded data has reached the certain amount (Fin 1 in FIG. 10).

After receiving Fin 1, the information processing circuit CPU starts graph processing. However, the preloading operation performed by the memory controller HyMC is carried out concurrently while the graph processing is performed after DRAM switching operation. When the preloading of all the data blocks to be required for the graph processing is ended, the memory controller gives notice to the information processing circuit CPU that the preloading operation is ended (Fin 2).

Figure 12:
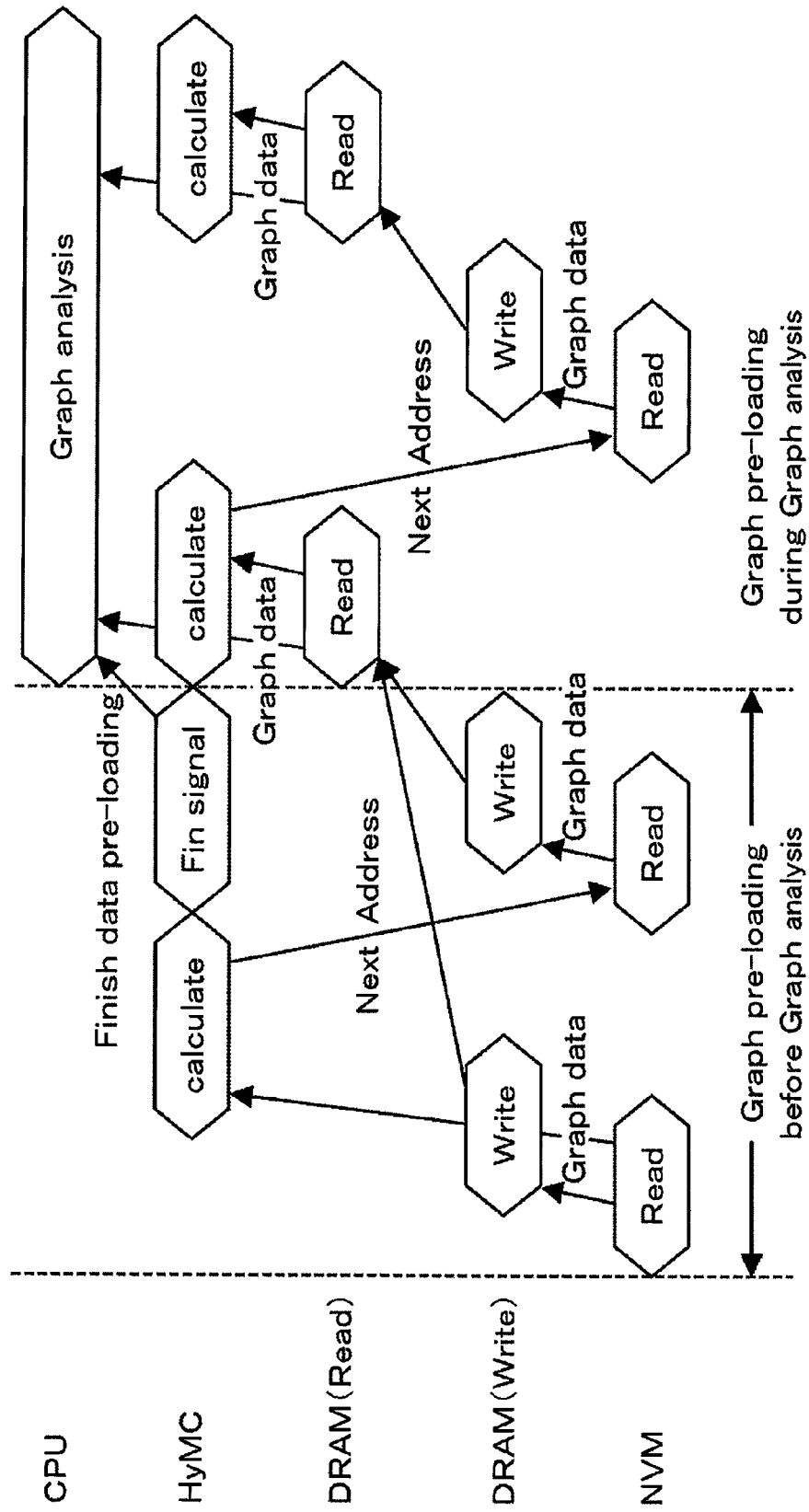
FIG. 12 is a view showing the outline of the operation of each component of the server at the time when downloaded graph data is processed.

The zone indicated by Graph pre-loading in FIG. 12 represents the above-mentioned preloading operation. On the basis of the addresses of the graph data calculated autonomously, the memory controller HyMC reads out the graph data to be required for the graph processing from the NVM 132 (READ) and writes the graph data into the DRAM chips 133 and 112 repeatedly, and transmits a Fin signal to the information processing circuit CPU. Then, the preloading operation performed by the memory controller HyMC continues (graph pre-loading during graph analysis) concurrently with the graph processing performed by the information processing circuit CPU.

Next, the graph data reading operation in the graph processing performed by the information processing circuit CPU will be described.

After receiving Fin 1 from the memory controller HyMC, the information processing circuit CPU(0) starts the graph processing (Graph analysis) (Start).

First, the information processing circuit CPU(0) transmits an instruction to one of the information processing circuits CPU(0) to CPU(m) to perform the first step (Step 1) of the graph processing. It is assumed that the information processing circuit CPU to which the instruction is transmitted is CPU(1). In the case that the data block (Data 1) to be required at the first step (Step 1) of the graph processing is present in the DRAM 112 located directly below the CPU(1), the CPU (1) directly reads Data 1 from the DRAM 112 located directly below. In the case that Data 1 is present in the DRAM 133 inside the memory sub-system, the CPU(1) transmits a data request to the corresponding memory controller HyMC (Req 1). After receiving the request, the memory controller HyMC transfers Data 1 from the DRAM 133 inside the memory sub-system to the CPU(1) (To H1).

The information processing circuit CPU(0) or CPU(1) performs Step 1 of the graph processing using Data 1 and then transmits an instruction to one of the information processing circuits CPU(0) to CPU(m) to process Data 2 to be required for the next step (Step 2) of the graph processing as in the case of Data 1. Also as in the case of Data 1, the CPU to which the instruction is transmitted reads out Data 2 from the DRAM 112 located directly below or from the corresponding DRAM 133 inside the memory sub-system in which Data 2 is stored.

While the information processing circuit CPU reads out Data 1 and Data 2 successively, the memory controller HyMC transfers data, Data (n+1), Data (n+2), . . . , to be required by the information processing circuit CPU from the non-volatile memory chips 132 to the DRAM chips 133.

In this way, in the one memory space 300, while large graph data is being stored into the non-volatile memory chips NVM 132 inside the memory sub-systems, the information processing circuit CPU can read out data to be required for the graph processing from the DRAM chips (112 and 133) at all times.

The processing in the zone of Graph analysis shown in FIG. 12 corresponds to the graph processing (Graph analysis) after (Start) shown in FIG. 10. In the zone, the preloaded graph data is read (READ) out from the DRAM chips 133 and 112 and transferred to the CPU by the memory controller HyMC. Then, the graph processing (Graph analysis) is performed sequentially in the CPU at (Step1) and (Step 2). Furthermore, while the graph processing is performed in the CPU, the memory controller HyMC concurrently preloads the graph data to be required by the CPU in the future from the NVM chips 132 to the DRAM chips 133 and 112 (graph pre-loading during graph analysis).

Finally, graph processing result writing operation and pre-load optimizing operation will be described.

While the graph processing performed by the information processing circuit CPU is carried out, the result of the graph processing is stored in the memory sub-systems as necessary. At the time, a certain amount of the result of the graph processing is stored into the DRAM chips inside the memory sub-systems once while addresses are assigned there to, and then pooled data is written in the non-volatile memory chips.

Furthermore, during the graph processing performed by the information processing circuit CPU, the memory sub-system measures the speed of the graph processing performed by the information processing circuit CPU and the preloading speed, and compares them, and then changes the preloading speed dynamically. Moreover, after the graph processing, when the graph processing is performed again using the same application, the preloading speed and the amount of preloaded data before the graph processing are optimized so that the graph processing is performed at high speed.

In the case that two kinds of memory chips having different reading and writing latencies, in other words, two kinds of memory chips having different prices, are combined and disposed in one memory space as described above, a large memory space required for processing a large graph can be provided at low cost. Even in this case, the CPU can perform graph processing at a speed similar to that in the case that graph data is stored in memory chips having short reading and writing latencies.

Next, the details of the respective server operations described referring to FIGS. 9 to 12 will be described in the following items (2) to (6).

(2) Operation at the Time of Downloading Graph Data

The operation at the time of downloading graph data will be described referring to FIGS. 9 and 13.

Figure 13:
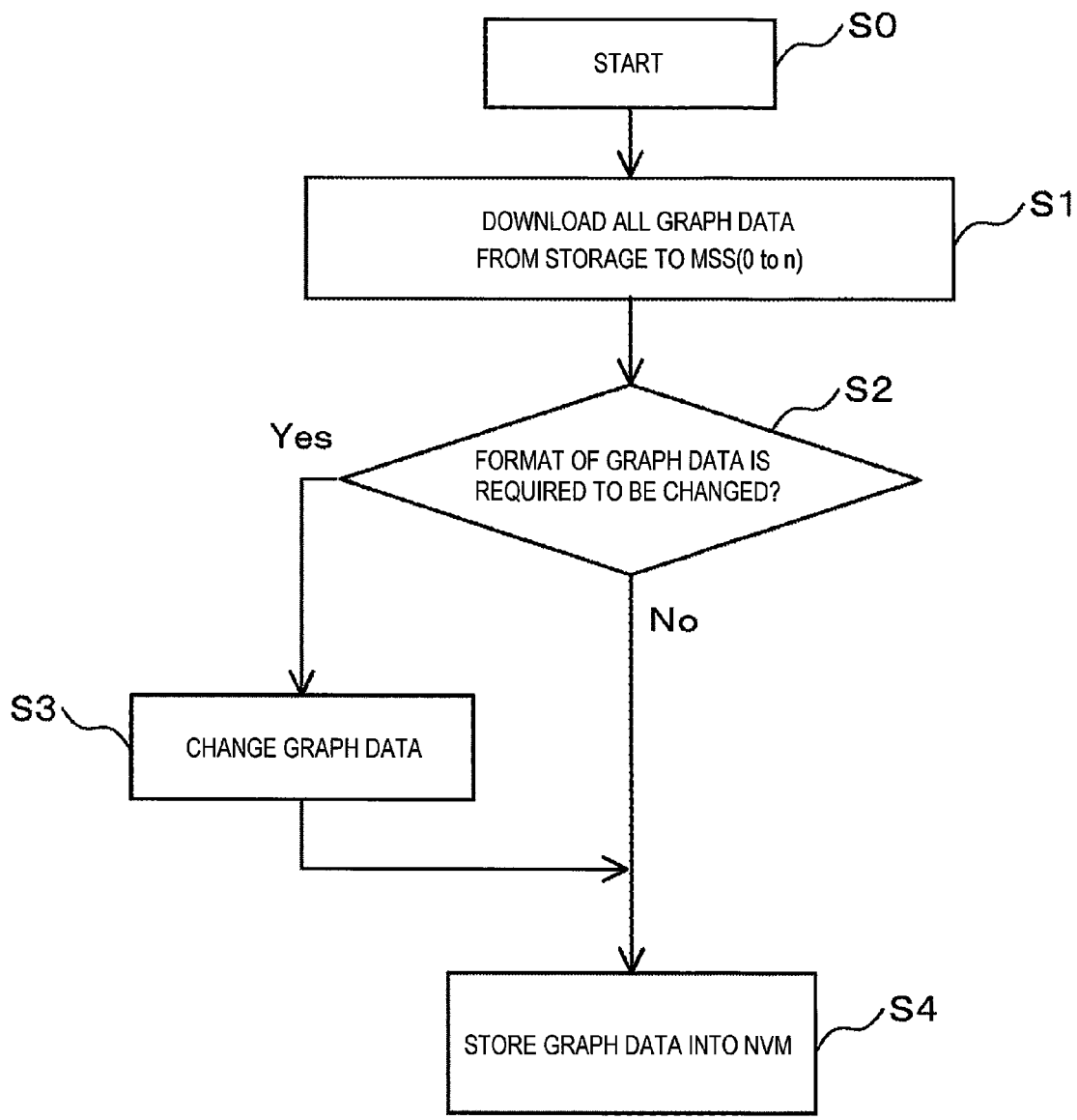
FIG. 13 is a flow chart showing an example of the operation performed by an information processing circuit CPU at the time when graph data is downloaded in the server shown in FIG. 1.

FIG. 13 is a flow chart showing an example of the operation performed by the information processing circuits CPU(0) to CPU (m) at the time when graph data is downloaded as described referring to FIG. 9. According to a graph processing instruction from the user of the server 100, the information processing circuits CPU(0) to CPU(m) download all the graph data from the external storage device 150 to the memory sub-systems MSS(0) to MSS(n) (at Step 1).

At the time, the information processing circuits CPU(0) to CPU(m) or the memory controller HyMC disposed in each memory sub-system reads out the data format of the graph (at Step 2). In the case that the data format is different from the data formats ((1) to (5)) of graph data to be handled by the above-mentioned server, the information processing circuits CPU(0) to CPU(m) or the memory controller HyMC disposed in each memory sub-system changes the graph data (at Step 3).

When the downloaded graph data is stored in the memory sub-systems MSS(0) to MSS(n), the memory controller HyMC disposed in each memory sub-system stores the graph data allocated to the memory sub-system belonging thereto into the non-volatile memory chips NVM(0) to NVM(j) (at Step 4).

Figure 14:
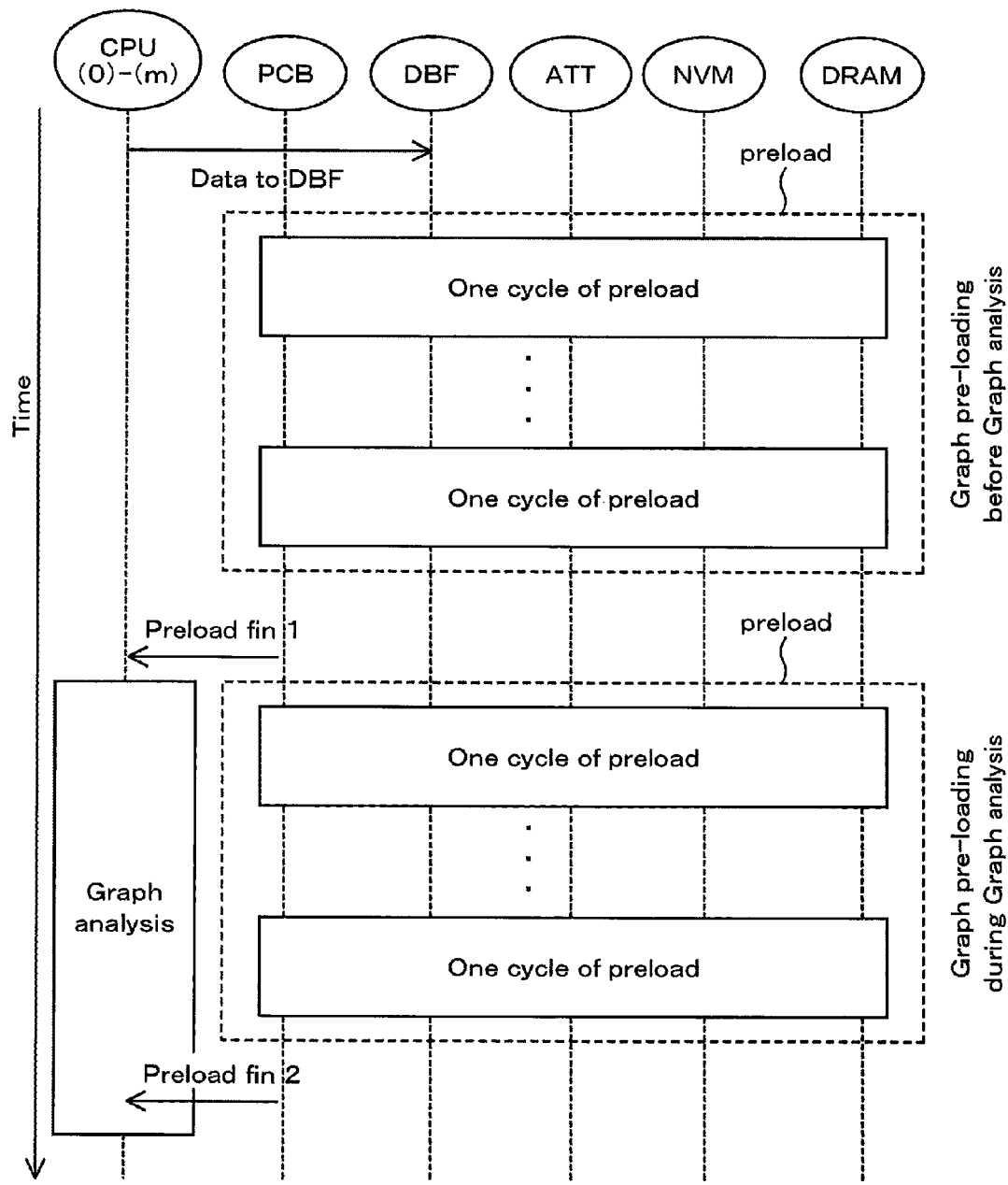
FIG. 14 is a schematic view showing an example of the operation performed by each of the information processing circuits CPU(0) to CPU(m) and the memory sub-system in the server shown in FIG. 1.

(3) Graph Data Preloading Operation Performed by memory controller HyMC (3-1) Outline of the Operation FIG. 14 is a schematic view showing an example of the outline of the graph data preloading operation performed by the memory controller HyMC.

The graph data preloading operation performed by the memory controller HyMC is carried out before and during the graph processing performed by the information processing circuit CPU and is composed by the repetition of (One cycle of preload).

First, before the start of the preloading operation, the information processing circuits CPU(0) to CPU(m) transmit the information and algorithm to be required for the memory controller HyMC to refer to the graph data inside the non-volatile memory chips and to autonomously calculate the address of the data to be required next in the graph processing to the memory sub-system via the network switch (Switch). The information and algorithm to be required to calculate the address of the data to be required next in the graph processing is stored in the data buffer DBF (Data to DBF).

The specific examples of the information and algorithm to be required for the memory controller HyMC to refer to the graph data inside the non-volatile memory chips and to autonomously calculate the address of the data to be required next in the graph processing are the start and goal of a path in the case of the problem of obtaining the shortest path, the sequence of data reference, the correspondence relationship between data values and logical addresses, information for specifying an application for performing graph processing, etc.

In the case that the memory controller HyMC has known beforehand part of the algorithm of the graph processing performed on the side of the CPU, such as the sequence of data reference, the information and algorithm to be transmitted to the memory sub-systems may be less than the examples described above.

Furthermore, after the information and algorithm are stored in the data buffer DBF, the preload control block PCB starts the graphic data preloading operation (Preload).

After a certain amount of the preloaded data is transmitted to the DRAM chips, the preload control block PCB notifies the information processing circuits CPU(0) to CPU(m) to that effect (Preload fin 1). At the start of the preloading, the preload control block PCB transmits as necessary, to the information processing circuits CPU(0) to CPU(m), a request for keeping the graph processing on standby until the notice of Preload fin 1 is given.

The information processing circuits CPU(0) to CPU(m) start the graph processing (Graph analysis) for the first time after receiving Preload fin 1 from the preload control block PCB.

Moreover, after the data block to be required at the end in the graph processing is preloaded, the preload control block PCB gives a preload end notice to the information processing circuits CPU(0) to CPU(m) (Preload fin 2) on the basis of Data to DBF and the data stored in the non-volatile memory chips NVM.

(3-2) The Details of One Cycle Operation of Preload Processing

Figure 15:
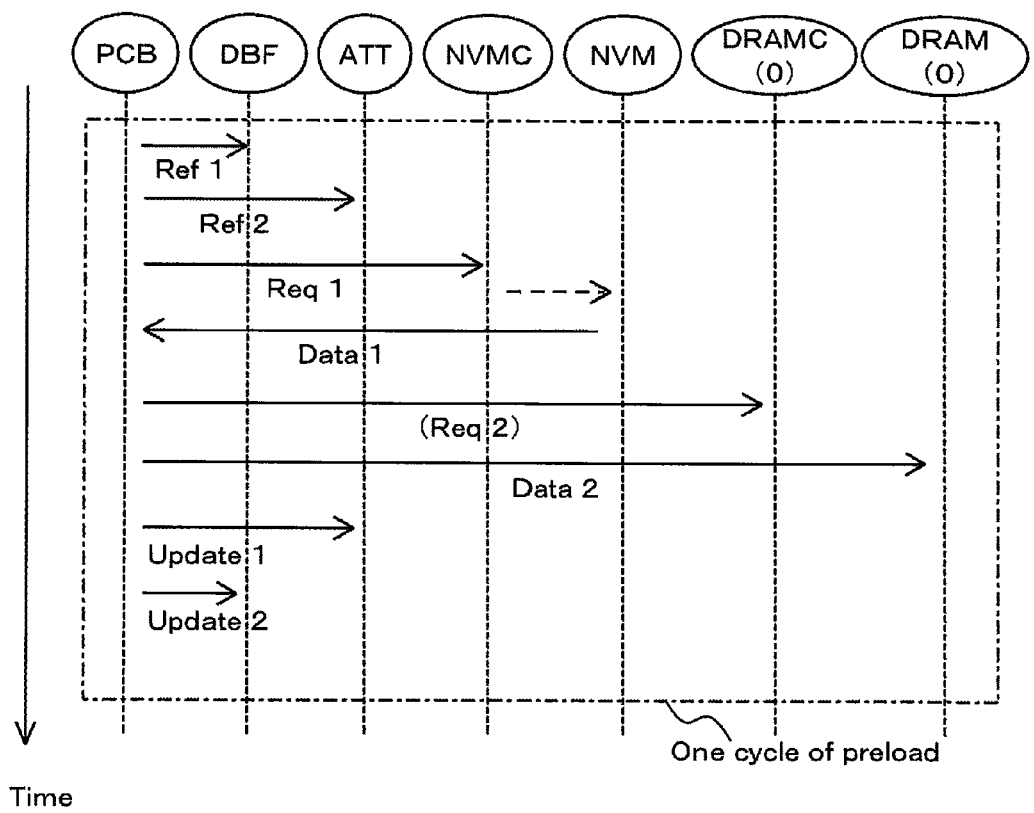
FIG. 15 is a schematic view showing an example of one cycle operation of the preload processing of graph data performed in the memory sub-system in the server shown in FIG. 1.

The details of graph data preloading operation performed by the memory controller will be described referring to FIG. 15. FIG. 15 is a schematic view showing one cycle operation (One cycle of preload) of the preload processing indicated by preload in FIG. 14.

At the start of the graph data preload processing, the preload control block PCB first refers to the data stored in the data buffer DBF (Ref 1).

By virtue of this reference, the preload control block PCB specifies the logical address of graph data block 0, part of the graphic data to be required first.

Next, the preload control block PCB refers to the address translation table ATT (Ref 2).

By virtue of this reference, the preload control block PCB specifies the physical address of the graph data block 0 to be required first.

The preload control block PCB transmits a request for reading out the graph data block 0 to be required first to the non-volatile memory control circuit NVMC (Req 1).

The non-volatile memory control circuit NVMC reads out the page including the requested graph data block 0 from the non-volatile memory NVM and transmits the page to the preload control block PCB (Data 1).

The preload control block PCB transmits a request for writing the transmitted data to the DRAM control circuit DRAMC(0) (Req 2), and the DRAM control circuit DRAMC (0) stores the graph data into the DRAM(0) on the basis of the transmitted request (Data 2).

Figure 16:
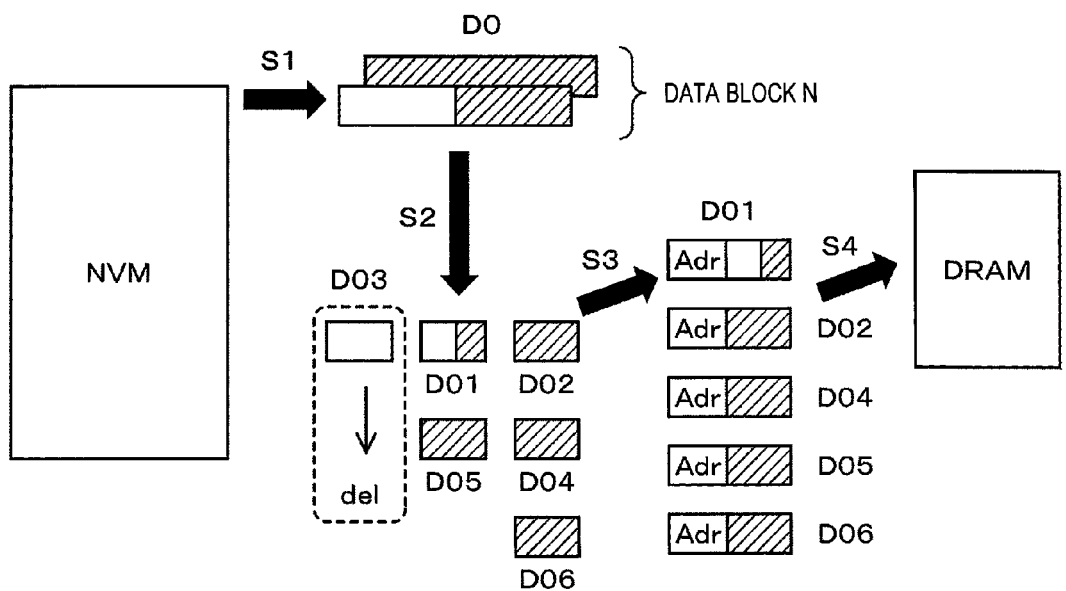
FIG. 16 is a schematic view showing an example of data extraction and address addition operation during the transfer of graph data from a non-volatile memory to a DRAM in the first embodiment.

Furthermore, since the data transfer size for the non-volatile memory NVM is determined in the units of pages or sectors, all the graph data read out from the NVM is not necessarily the graph data block to be required next. Hence, as shown in FIG. 16, the preload control block PCB reads out the data from the NVM in the units of pages or sectors (at Step 1) and then divides the read data into the units of data size requested by the CPU to the memory sub-system (at Step 2) as necessary. Data included in the divided data but not required by the CPU is deleted (del). Moreover, to the respective pieces of the divided data, logical addresses corresponding thereto are added (at Step 3), and the divided data is transferred to the DRAM (at Step 4, corresponding to (Data 2) in FIG. 15).

Then, the preload control block PCB updates the address translation table ATT (Update 1). In addition, the preload control block PCB counts the amount of data transfer.

The preload control block PCB updates information required for advancing the preload processing of the graph data stored in the data buffer DBF as necessary (Update 2). The information required for advancing the preload processing of the graph data is the list of vertex numbers to be loaded next and the list of vertex numbers having been preloaded in an example in which the problem of obtaining the shortest path on a graph in breadth-first search. In particular, in the example in which the problem of obtaining the shortest path on the graph in breadth-first search, it is necessary that an array 1 in which the vertex numbers whose depths are being searched at present are stored and an array 2 in which the vertex numbers whose depths are to be searched next should be controlled on the data buffer DBF.

After all the vertex numbers whose depths are being searched at present are preloaded, the roles of the array 1 and the array 2 are exchanged.

Furthermore, when the graph data is preloaded, the list of preloaded vertex numbers is referred to, and the vertex numbers having been preloaded are not stored in the array in which the vertex numbers whose depths are to be searched next are stored.

When the above matters are put together, the one cycle operation of the preload processing (One cycle of preload) is performed as described below, and the operation of One cycle of preload is repeated at the time of the preload processing.

(a) The preload control block PCB refers to the data read from the NVM and the data stored in the data buffer DBF (Ref 1) and specifies the logical address of the data to be required next.

(b) The preload control block PCB refers to the address translation table ATT (Ref 2) and specifies the physical address of the data to be required next.

(c) The preload control block PCB transmits a request for reading out the graph data to be required next to the non-volatile memory control circuit NVMC (Req 1).

(d) The non-volatile memory control circuit NVMC reads out the requested data from the non-volatile memory NVM and transmits the data to the preload control block PCB (Data 1).

(e) The preload control block PCB transmits a request for writing the transmitted data to the DRAM control circuit DRAMC(0) (Req 2).

(f) The DRAM control circuit DRAMC stores the graph data in the DRAM (0) on the basis of the transmitted request (Data 2).

(g) The graph data stored in the DRAM is divided as necessary into data request units determined in each CPU, only the portions including the data block to be required next are extracted, logical addresses are added to the divided data, and the divided data is stored in the DRAM in the sequence of data reference performed by each CPU (Data 2).

(h) The preload control block PCB updates the address translation table ATT (Update 1).

(i) The preload control block PCB counts the transferred amount of data.

(j) The preload control block PCB updates the information required for advancing the preload processing of the graph data stored in the data buffer DBF as necessary (Update 2).

The processing from (a) to (j) described above is repeated as shown in FIG. 14 until the amount of the data to be written into the DRAM reaches a certain amount. Then, the preload control block PCB gives notice to the information processing circuits CPU(0) to CPU(m) that the amount of the data preloaded to the DRAM has reached the certain amount (Preload fin 1).

It is assumed that this amount of the data has been notified from each CPU before the graph processing and stored in the data buffer DBF or determined beforehand and that each CPU and each preload control block PCB know the amount of data.

Alternatively, when the preload control block PCB referred to the data buffer DBF, in the case that an appropriate amount of preloaded data, having been calculated when the same application as the application being used to perform the graph processing at present was executed in the past, had been stored, the appropriate preload amount of the read data is used as the above-mentioned certain amount.

After giving the notice of Preload fin 1, the preload control block PCB continues the preload operation composed by the repetition of One cycle of preload concurrently with the graph processing performed by the information processing circuits CPU(0) to CPU(m). At the time, the DRAM serving as the transfer destinations of the graph data blocks in the preload operation is different from the DRAM serving as the reading destinations of the graph data to be read by the information processing circuits CPU(0) to CPU(m). The difference may be a difference due to different physical regions of the same DRAM chip, different DRAM chips or different DIMMs).

Furthermore, after the data block to be required at the end in the graph processing was preloaded, the preload control block PCB gives a preload end notice to the information processing circuits CPU(0) to CPU(m) (Preload fin 2) on the basis of Data to DBF and the data stored in the non-volatile memory chips NVM.

As described above, a significant feature of graph data is that the sequence of accessing graph data blocks by the information processing circuits CPU is not determined at the time of data download. Even if two types of graph data are the same on the whole, the sequence of accessing the data blocks may change depending on, for example, initial conditions (the start vertex in the above-mentioned example). Hence, unless the initial conditions and the values of the data blocks are synthesized as shown in Case A in FIG. 17, the address of the data block to be required next cannot be specified. Therefore, graph data is essentially different from data, the data accessing sequence of which has been determined from the beginning (Case B in FIG. 17) as in the case of the streaming of moving images, for example. Hence, data access speed-up technology targeted for such data cannot attain the speed-up of the graph data processing.

Figure 18:
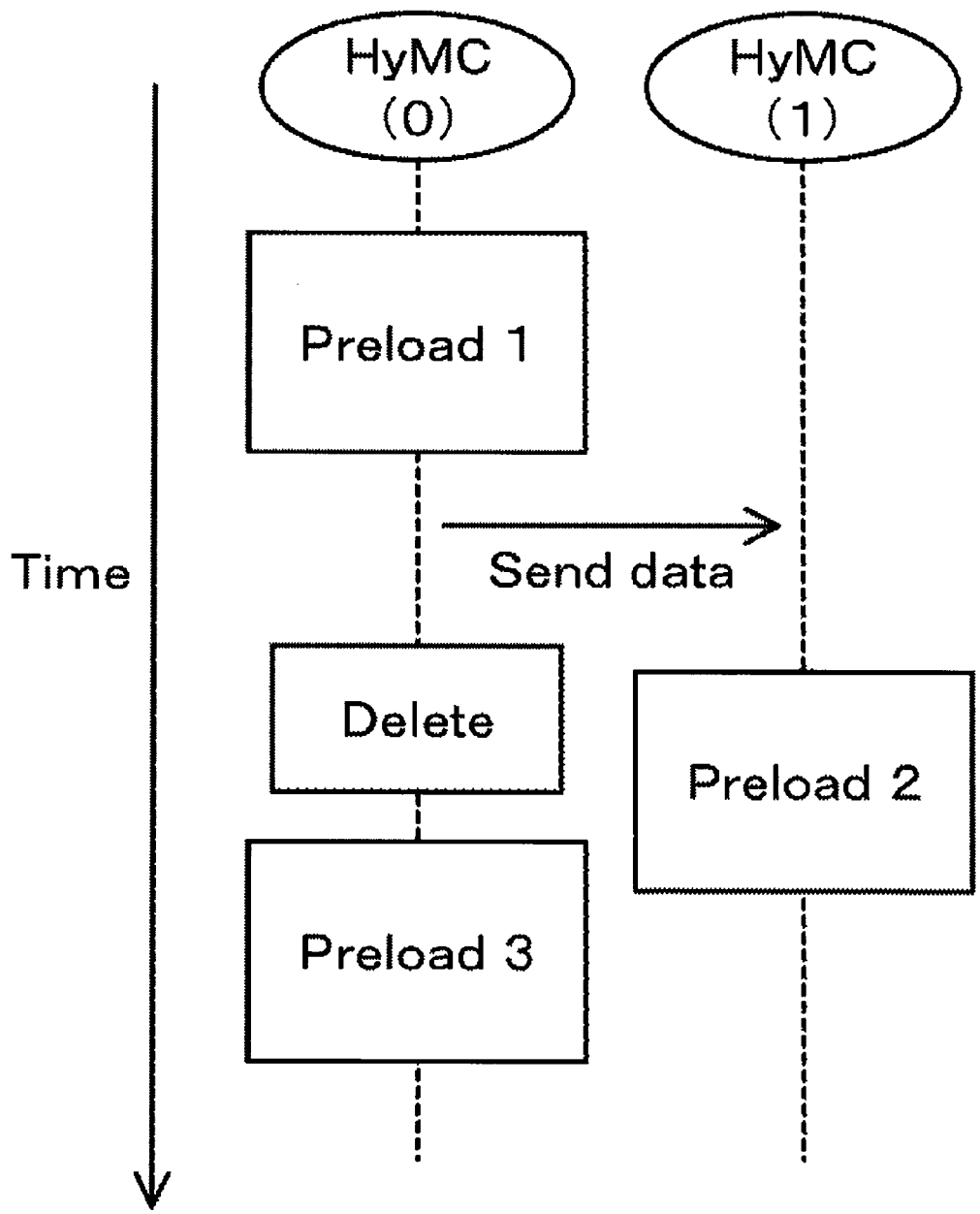
FIG. 18 is a schematic view showing an example of operation at the time when graph data extends over a plurality of memory sub-systems in the server shown in FIG. 1.
Figure 19:
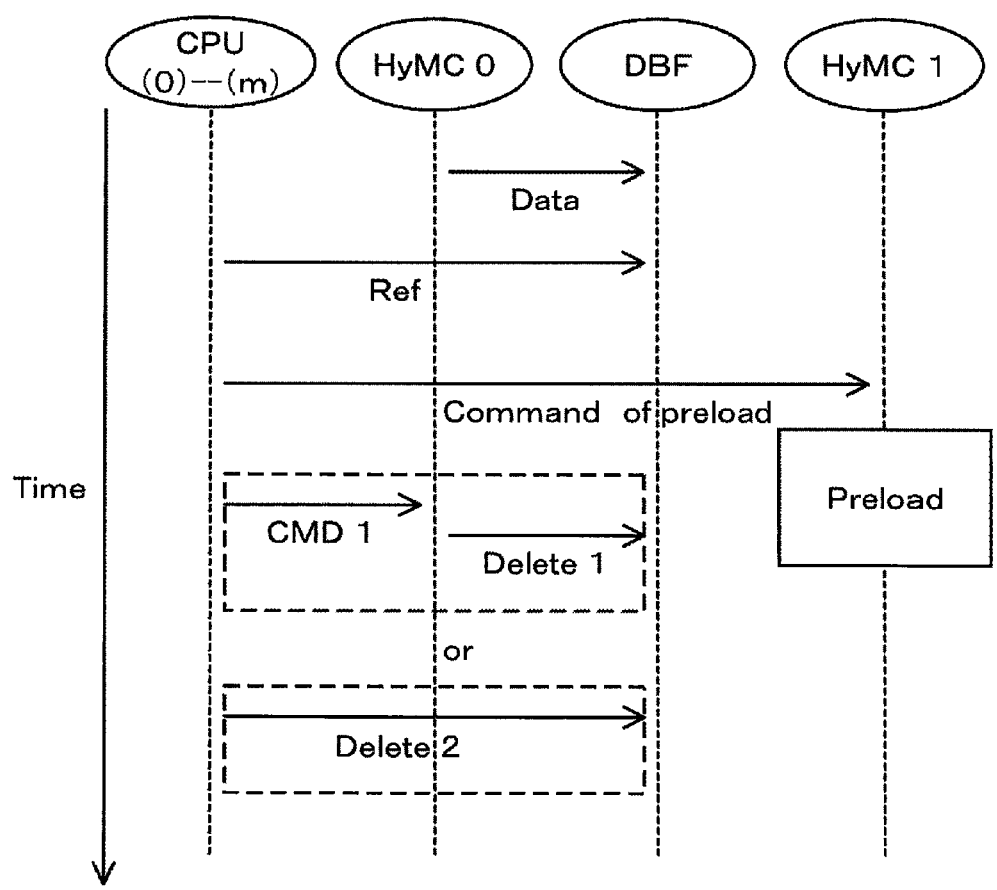
FIG. 19 is a schematic view showing another example of operation at the time when graph data extends over a plurality of memory sub-systems in the server shown in FIG. 1.

(3-3) Preload Operation in the Case that Graph Data Extends Over a Plurality of the Memory Sub-Systems FIGS. 18 and 19 are schematic views showing operation examples in the case that graph data extends over a plurality of the memory sub-systems.

In the above-mentioned preload operations (3-1) and (3-2), the operation to be performed in the case that graph data extends over a plurality of the memory sub-systems is either operation a shown in FIG. 18 or operation b shown in FIG. 19.

(Operation a) As shown in FIG. 18, when the memory controller HyMC(0) is performing the above-mentioned Preload operations (3-1) and (3-2) (Preload 1), in the case that the graph data block to be required next is not present in the non-volatile memory NVM disposed in the same memory sub-system, the preload control block PCB in the memory controller HyMC(0) transfers the data to be required when the graph data extends over a plurality of the memory sub-systems to the memory controller HyMC(1) of another memory sub-system via the network switch (Switch) connected to the memory controller HyMC(0) (Send data).

In other words, Send data shown in FIG. 18 is defined as operation in which in the case that graph data extends over a plurality of the memory sub-systems MSS in the memory space 300 as shown in FIG. 9, the memory controller HyMC (0) having been performing the preload operation up to now reads out the data to be required for advancing the preload operation in the memory controller HyMC(1) belonging to the other memory sub-system MSS from the non-volatile memory NVM or the DRAM inside the MSS as necessary and transfers the data to the memory controller HyMC(1) of the other memory sub-system via the network switch (Switch).

Figure 20:
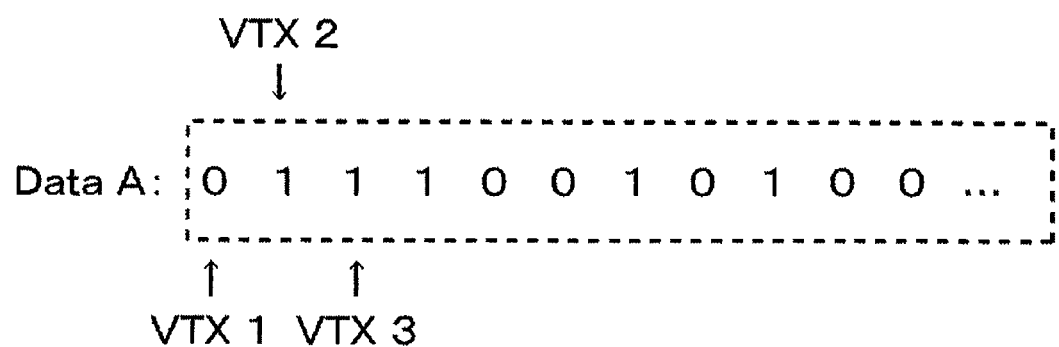
FIG. 20 is a schematic view showing an example of data to be transmitted to another memory sub-system at the time when graph data extends over a plurality of memory sub-systems in the server shown in FIG. 1.

In an example of the problem of obtaining the shortest path in breadth-first search, data to be required when graph data extends over a plurality of the memory sub-systems is such a preloaded vertex number list (Data A) as shown in FIG. 20 and the vertex number to be preloaded next or the logical address of data (Data B). The preloaded vertex number list of Data A uses one bit to represent whether each of vertex numbers (VTX 1, VTX 2 and VTX 3) has been preloaded. In FIG. 20, vertex numbers not preloaded are represented by "0" and preloaded vertex numbers are represented by "1", whereby preloaded vertex numbers are 2, 3, 4, 7, 9, . . .

After the data to be required when graph data extends over a plurality of the memory sub-systems is transmitted to the memory controller HyMC(1) of the other memory sub-system, the preload control block PCB in the memory controller HyMC(0) deletes the data to be required when graph data extends over (Delete). Hereafter, the preload control block PCB of the memory controller HyMC(0) continues the preload operations (3-1) and (3-2) (Preload 3).

The memory controller HyMC(1) of the other memory sub-system having received the data to be required when graph data extends over a plurality of the memory sub-systems starts preloading of the graph data on the basis of the data to be required when the received graph data extends over (Preload 2).

When an example of the problem of obtaining the shortest path in breadth-first search is taken, the memory controller HyMC(1) of the other memory sub-system having received Data A and Data B starts preloading of graph data beginning with the received vertex number.

(Operation b) As shown in FIG. 19, when the memory controller HyMC(0) is performing the preloading operations (3-1) and (3-2), in the case that the graph data block to be required next is not present inside the non-volatile memory inside the same memory sub-system, the preload control block PCB in the memory controller HyMC(0) stores the data to be required when graph data extends over in a plurality of the memory sub-systems into the data buffer DBF (Data).

Furthermore, the information processing circuits CPU(0) to CPU (m) refer to the data buffers DBF of all the memory sub-systems periodically (Ref). In this case, the data to be required at the time of extending over is present in the data buffer DBF controlled by the HyMC(0). Hence, the information processing circuits CPU(0) to CPU(m) instruct the memory controller HyMC(1) of the memory sub-system in which the graph data block to be required next is present to start preloading of data (Command of preload).

Then, the information processing circuits CPU(0) to CPU (m) delete the data to be required when the graph data, being present in the data buffer DBF, extends over (Delete 2).

Alternatively, the information processing circuits CPU(0) to CPU(m) instruct the preload control block PCB to delete the data to be required when the graph data extends over (CMD 1). The preload control block PCB having received the instruction deletes the data to be required when the graph data extends over (Delete 1).

(4) Graph Data Reading Operation in Graph Processing Performed by the Information Processing Circuit CPU (4-1) Overall Flow of Graph Data Reading Operation First, the graph data reading operation performed by the information processing circuit CPU will be described.

Figure 21:
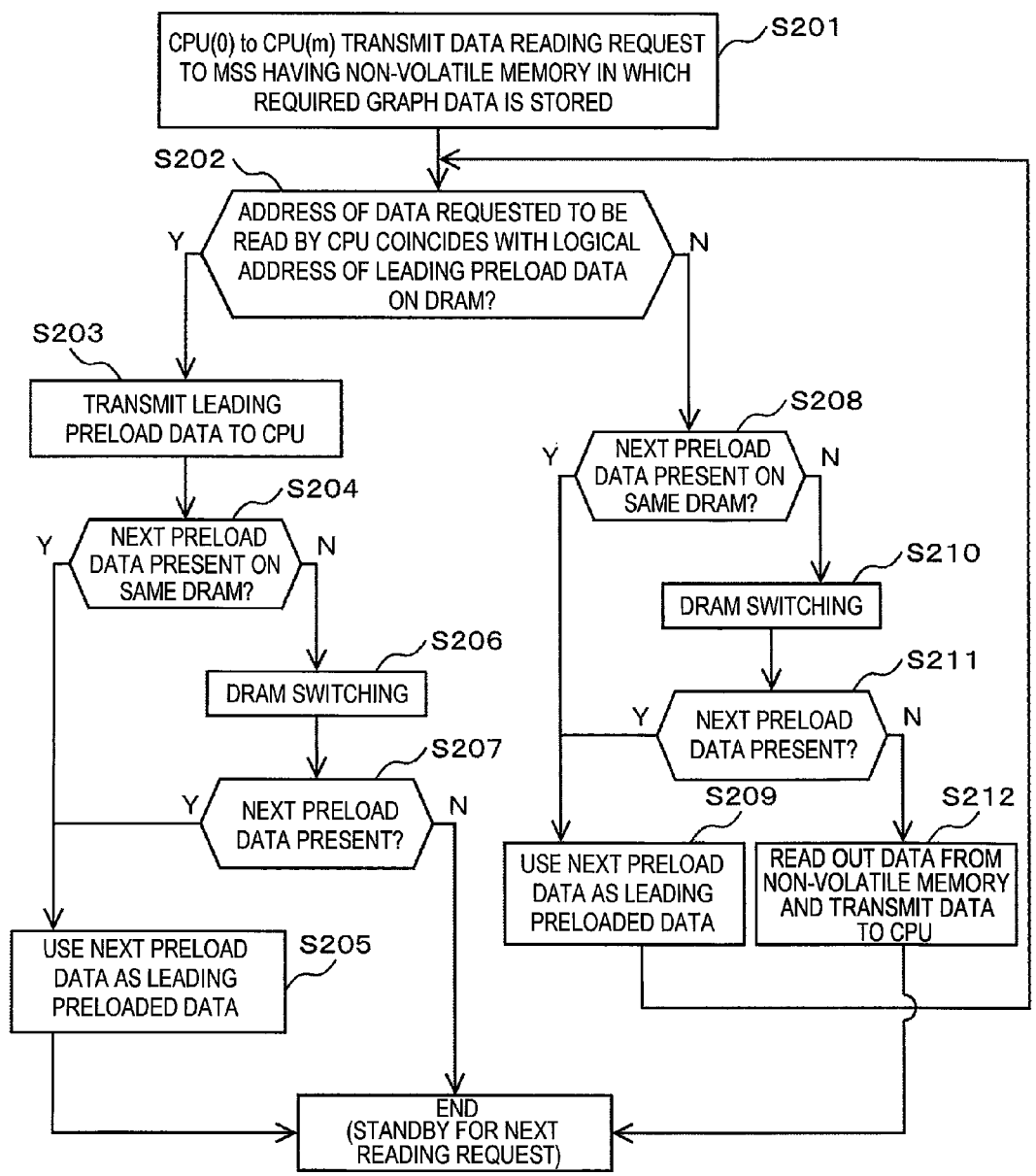
FIG. 21 is a flow chart showing an example of the operation of the memory sub-system at the time when the information processing circuit reads out the preloaded data from the memory sub-system in the first embodiment.

FIG. 21 is a flow chart showing the operation of the memory controller HyMC at the time of reading graph data.

After receiving the notice of Preload fin 1 shown in FIG. 14 from the preload control block PCB, the information processing circuits CPU(0) to CPU(m) perform graph processing.

First, in the graph processing, the information processing circuits CPU(0) to CPU(m) transmit a data reading request to the memory sub-system having the non-volatile memory in which the graph data to be required for the graph processing is stored (at Step 201).

The preload control block PCB of the memory sub-system to which the data reading request is given compares the address of the data requested to be read by the information processing circuit CPU with the logical address of the leading preload data on the DRAM in which the preload data is stored and then judges whether the two coincide with each other (at Step 202).

In the case that the two addresses coincide (Y at Step 202), the preload control block PCB transmits the leading preload data to the information processing circuit CPU (at Step 203). Then, the preload control block PCB judges whether the next preload data is present on the same DRAM (at Step 204).

In the case that the next preload data is present on the same DRAM (Y at Step 204), the preload control block PCB uses the next preload data as the leading preload data (at Step 205), and the flow is ended (End). After the end of the flow, the processing is in a state of standby for a reading request from the information processing circuit CPU.

In the case that the next preload data is not present on the same DRAM (N at Step 204), the preload control block PCB switches DRAM chips (at Step 206). DRAM switching will be described later in (4-2).

After the DRAM switching, the preload control block PCB judges whether the next preload data is present (at Step 207). In the case that the next preload data is present, the next preload data is used as the leading preload data (at Step 205), and the flow is ended (End). In the case that the next preload data is not present, nothing is done and the flow is ended (End). In either case, the processing is in a state of standby for a reading request from the information processing circuit CPU.

In the case that the two addresses do not coincide (at Step 202) (N at Step 202), the preload control block PCB judges whether the next preload data is present on the same DRAM (at Step 208).

In the case that the next preload data is present on the same DRAM (Y at Step 208), the preload control block PCB uses the next preload data as the leading preload data (at Step 209) and the processing returns to Step 202.

In the case that the next preload data is not present on the same DRAM (N at Step 208), the preload control block PCB switches DRAM chips (at Step 210) and then judges whether the next preload data is present (at Step 211).

In the case that the next preload data is present, the preload control block PCB uses the next preload data as the leading preload data (at Step 209) and the processing returns to Step 202.

In the case that the next preload data is not present, the preload control block PCB reads data from the non-volatile memory NVM (at Step 212). The preload control block PCB transmits the data to the information processing circuit CPU and the flow is ended (End). After the end, the processing is in a state of standby for a reading request from the information processing circuit CPU.

(4-2) DRAM Switching

Figure 22:
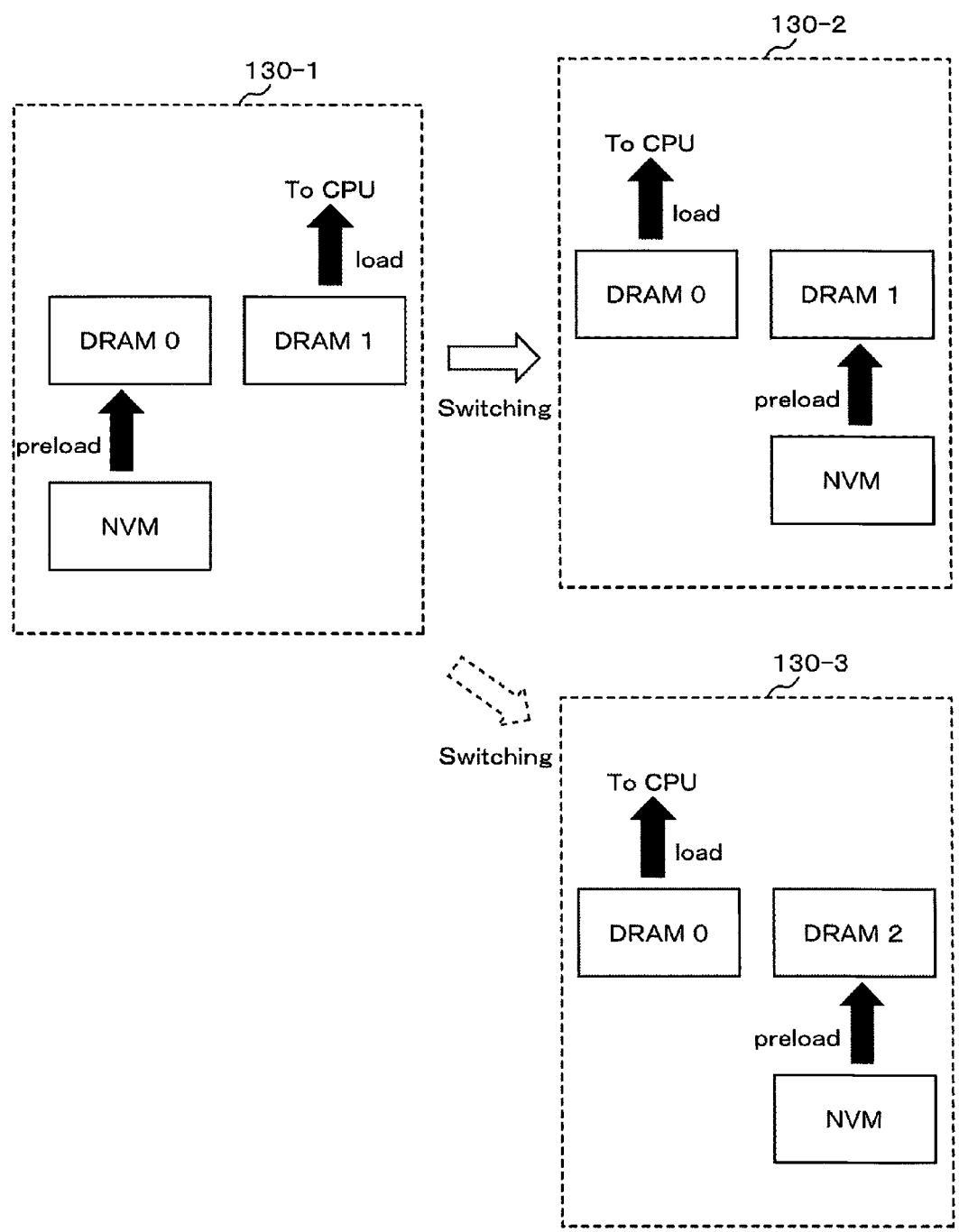
FIG. 22 is a schematic view showing an example of the switching of DRAM chips serving as writing destinations in the transfer operation of graph data from the non-volatile memory to the DRAM performed during graph processing in each information processing circuit in the first embodiment.

DRAM switching will be described below referring to FIG. 22.

The preload processing in (3) is performed concurrently during the graph data reading operation (4-1). In the preload processing being performed concurrently, the DRAM (the left DRAM 0) serving as the storage destination of the data read from the non-volatile memory NVM is different from the DRAM (the left DRAM 1) in which the graph data to be read by the information processing circuit CPU is stored in the graph data reading operation (4-1). The difference may be a difference due to different physical regions of the same DRAM chip, different DRAM chips or different DIMMs).

At the timing of DRAM switching described in (4-1), the preload control block PCB assigns DRAM 0 having being used as the transfer destination of the graph data from the non-volatile memory NVM to the DRAM (the right DRAM 0) in which the graph data to be read by the information processing circuit CPU is stored and newly assigns a DRAM different from the DRAM 0 as the DRAM to be used as the transfer destination of the graph data from the non-volatile memory NVM.

Furthermore, in the case that a certain amount of graph data has been pooled in the DRAM being used as the transfer destination of the graph data from the non-volatile memory NVM before the DRAM switching is carried out, the data preload operation (3) is stopped temporarily until the DRAM switching is performed and the operation is resumed after the DRAM switching.

It is assumed that this amount of the data has been notified from each CPU before the graph processing and stored in the data buffer DBF or determined beforehand and that each CPU and the preload control block PCB know the amount of data.

Alternatively, when the preload control block PCB referred to the data buffer DBF, in the case that an appropriate amount of preloaded data, having been calculated when the same application as the application being used to perform the graph processing at present was executed in the past, had been stored, the appropriate preload amount of the read data is used as the amount of the data.

Figure 23:
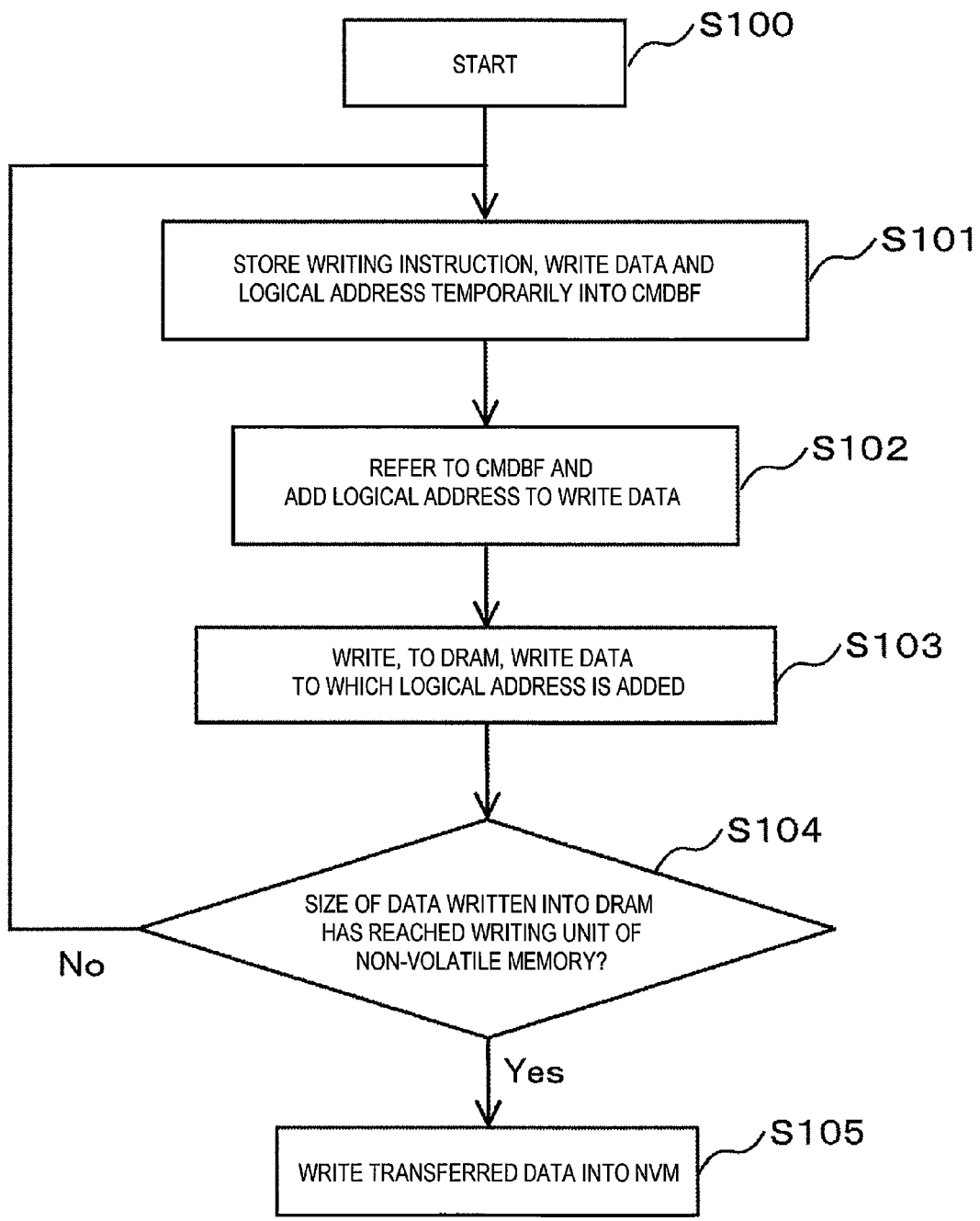
FIG. 23 is a flow chart showing an example of graph processing result writing operation in the first embodiment.

(5) Graph Processing Result Writing Operation in Graph Processing Performed by Information Processing Circuit CPU FIG. 23 shows an example of a flow chart showing graph processing result writing operation in each of the information processing circuits.

In the case that a request for writing the result of the graph processing obtained by the information processing circuits CPU(0) to CPU(m) is transmitted to the memory sub-system, the writing instruction, write data and logical address are stored temporarily into the command buffer CMDBF (at Step 101).

The preload control block PCB refers to the command data buffer CMDBF, adds a logical address to the write data (at Step 102), and transmits a writing request to the DRAM control circuit DRAMC.

The DRAM control circuit DRAMC writes, to the DRAM, the write data to which the logical address is added (at Step 103).

When the size of the data written into the DRAM has reached the writing unit of the non-volatile memory by performing the above operation (Yes at Step 104), the preload control block PCB transmits a data reading request to the DRAM control circuit DRAMC. The DRAM control circuit DRAMC transfers the data requested from the DRAM to the preload control block PCB.

The preload control block PCB transmits a writing request to the non-volatile memory control circuit NVMC to write the transferred data into the non-volatile memory NVM. The non-volatile memory control circuits NVMC writes the data into the non-volatile memory NVM according to the request (at Step 105).

Figure 24:
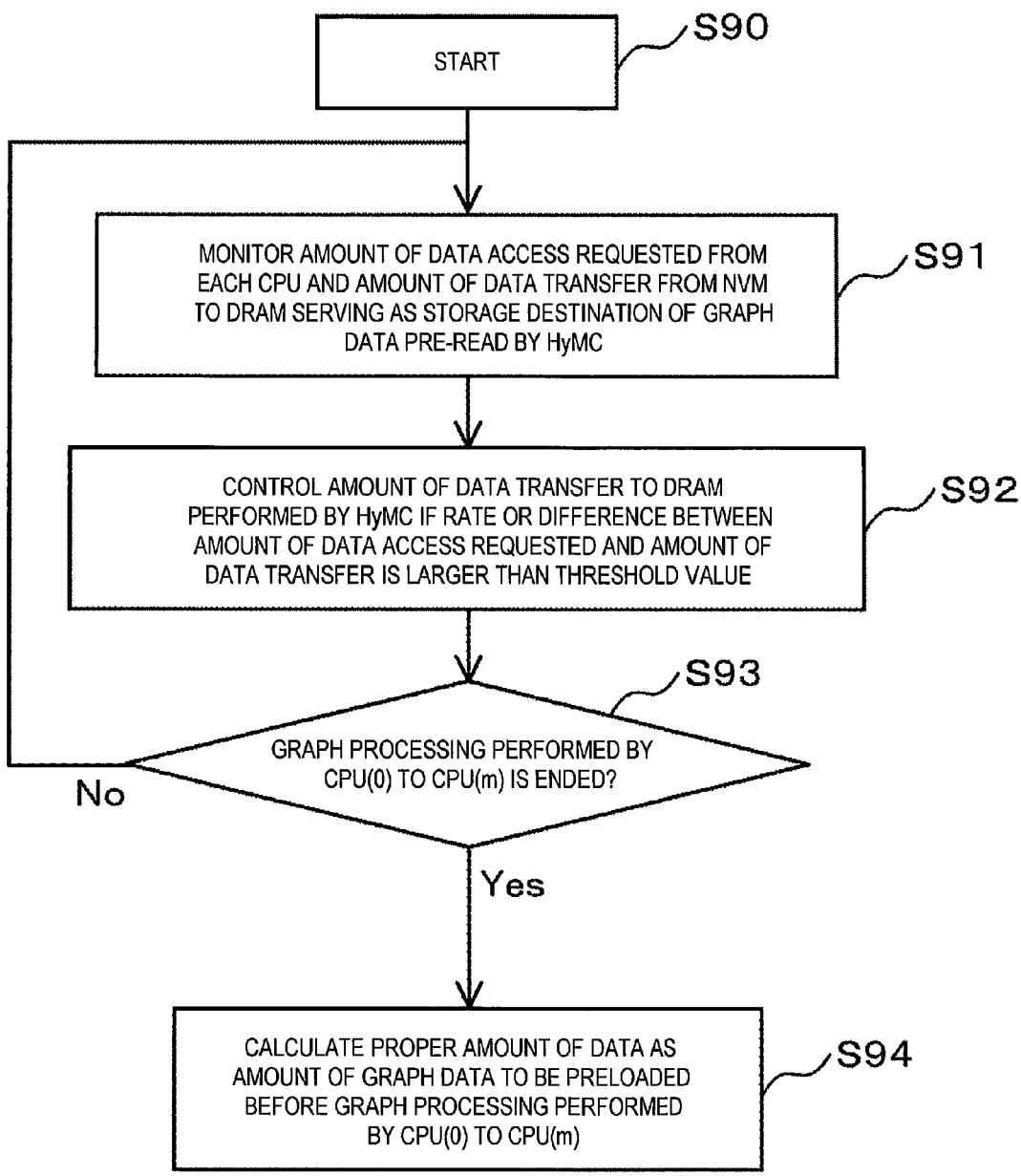
FIG. 24 is a flow chart showing an example of the operation of the memory sub-system in which the amount of data to be transferred from the non-volatile memory to the DRAM is changed dynamically in the server shown in FIG. 1.

(6) Preload Optimizing Operation During Graph Processing and after Graph Processing FIG. 24 shows an example of a flow chart showing operation in which the preload control block PCB dynamically changes the amount of graph data to be transferred from the non-volatile memory to the DRAM. The operation for dynamically changing the amount of graph data to be transferred during graph processing is indicated at Step 91 to Step 93 in FIG. 24.

First, while the information processing circuit CPU performs graph processing, the preload control block PCB periodically monitors the amount of data access requested from the information processing circuit CPU per unit time and the amount of data transfer performed by the memory controller HyMC also per unit time from the non-volatile memory NVM to the DRAM serving as the storage destination of pre-read graph data (at Step 91).

In the case that the ratio or difference between the amount of data access requested from the information processing circuit CPU per unit time and the amount of data transfer performed by the memory controller HyMC per unit time from the non-volatile memory NVM to the DRAM serving as the storage destination of pre-read graph data is larger than a certain threshold value as the result of the monitoring, the preload control block PCB controls the amount of data transfer performed by the memory controller HyMC to the DRAM serving as the storage destination of pre-read graph data (at Step 92).

For example, in the case that the amount of data access requested from the information processing circuit CPU per unit time is significantly smaller than the amount of data transfer performed by the memory controller HyMC per unit time from the non-volatile memory NVM to the DRAM serving as the storage destination of pre-read graph data, the preload control block PCB decreases the amount of data transfer from the NVM to the DRAM. In the case that the relationship therebetween is opposite, the preload control block PCB increases the amount of data transfer from the NVM to the DRAM.

The preload control block PCB judges whether the graph processing performed by the information processing circuit CPU is ended (at step 93). In the case that the processing is not ended, Step 91 and Step 92 are repeated periodically. In the case that the graph processing is ended, the preload control block PCB calculates, on the basis of the results of the control at Step 91 and Step 92, a proper amount of data as an amount of graph data to be preloaded before the graph processing of the information processing circuit CPU (at Step 94).

The result of the calculation is stored in the data buffer DBF or the non-volatile memory NVM together with the information for specifying the application.

In the above-mentioned description, an example of a server is taken in which the DRAM chips are used as the first memory and the second memory, the non-volatile memory is used as the third memory, and the information processing circuits CPU execute the graph processing program. However, the reading and writing latencies of the third memory may be longer than those of the second memory and the first memory, and the memory chips in the present invention are not limited to the combinations of DRAM chips and non-volatile memory chips.

<F. Summary of the Advantages of the Invention in Embodiment 1>

As described above, main advantages obtained by the first embodiment according to the present invention are as follows.

A large memory space required for processing a large graph and capable of achieving high-speed random access to graph data can be provided at low cost. Furthermore, even in that case, graph processing can be performed at a speed similar to that in the case that graph data is stored in memory chips having short reading and writing latencies.

In other words, when graph processing is performed, a large memory space required for processing a large graph using the first memory and the second memory and also using the third memory having reading and writing latencies longer than those of the first memory and the second memory can be provided at low cost. Furthermore, even in that case, graph processing can be performed at a speed similar to that in the case that graph data is stored in the first memory and the second memory.

Moreover, even in the case that graph data has been dispersed in a plurality of third memory chips controlled by a plurality of memory controllers, the above-mentioned high-speed graph processing can be attained.

Still further, waste in the computational resources of each CPU and memory controller can be saved during the above-mentioned high-speed graph processing by measuring the amount of data processing in each CPU and the amount of data transfer from the third memory to the first memory and the second memory.

In the above-mentioned first embodiment according to the present invention, one server (SVR) is used to configure an information processor. However, a plurality of servers connected via a network may also be used to configure an information processor so that the first, second and third memory chips are disposed in the memory space of each server and one CPU in one server supervises the entire processing. Alternatively, PC clusters equipped with concurrent programs operating cooperatively on a plurality of computers may be used to configure an information processor so that the first, second and third memory chips are disposed in a memory space shared by the slave computers of the PC clusters.

The invention made by the present inventors has been described above specifically based on the embodiment thereof. However, it is obvious that the present invention is not limited to the embodiment and may be modified in various ways without departing from the scope of the invention.

What is claimed is:

1. An information processor comprising:
an information processing sub-system; and
a plurality of memory sub-systems performing data communication with the information processing sub-system, wherein:
the information processing sub-system has an information processing circuit for processing a graph according to graph processing instructions,
the memory sub-system has a first memory, a second memory having reading and writing latencies longer than those of the first memory, and a memory controller for controlling data transfer between the first memory and the second memory,
in graph data to be subjected to the processing of the graph, to each of the vertices of the graph, an ID for uniquely specifying each of the vertices is assigned, and in the case that the ID assigned to one of the vertices is known, it is possible to specify where the IDs of other vertices relating to the vertex are located in an address space, and the graph data is stored in two or more different memory sub-systems and has a plurality of data blocks,
at least one pair of relating vertices of the graph meets the following condition: the memory sub-system storing one vertex of a pair is different from the memory sub-system storing the other vertex of a pair,
the data block is all or part of data corresponding to an address identified by analyzing the ID of the one vertex using the memory controller, and at least the ID of the one vertex is recorded therein,
the memory controller has a function of storing the graph data to be processed into the second memory, a preloading function of transferring the plurality of data blocks from the second memory to the first memory, and a function of generating additional information which is necessary for another memory controller of a different memory sub-system to take over the preloading function from the said memory controller, and
by using the preloading function, the memory controller:
autonomously analyzes the ID of at least one vertex included in one data block A of the data blocks, calculates the address of at least one data block B to be required next by the information processing circuit, and transfers the data block B from the second memory to the first memory,
then analyzes the ID of at least one vertex included in the data block A or block B transferred previously from the second memory to the first memory or included in a data block C different from the data blocks A and B, calculates the address of at least one data block D to be required next by the information processing circuit, and transfers the data block D from the second memory to the first memory, and
then similarly transfers a plurality of data blocks from the second memory to the first memory.

2. The information processor according to claim 1, wherein the memory controller, which generated the additional information, sends the additional information to another memory controller which takes over the preloading function, and then the memory controller which received the additional information executes the preloading function taken over from the said memory controller.

3. The information processor according to claim 1, wherein the memory controller, which generated the additional information, stores the additional information in a buffer and the additional information stored in the buffer can be read by the information processing circuit.

4. The information processor according to claim 3, wherein the information processing circuit reads the additional information stored in the buffer, sends a command for taking over the preloading function to the memory controller which takes over and executes the preloading function, and the memory controller received the command takes over and executes the preload function.

5. The information processor according to claim 1, wherein the additional information contains at least one item on the preload function listed in the following: (a) a list of IDs of vertices transferred previously from the second memory to the first memory; (b) an ID of a vertex which is transferred next from the second memory to the first memory; and (c) an address corresponding to the graph data of a vertex which is transferred next from the second memory to the first memory.

* * * * *